United States Patent
Tanitsu

(10) Patent No.: US 9,057,963 B2
(45) Date of Patent: Jun. 16, 2015

(54) ILLUMINATION OPTICAL SYSTEM, EXPOSURE APPARATUS, OPTICAL ELEMENT AND MANUFACTURING METHOD THEREOF, AND DEVICE MANUFACTURING METHOD

(71) Applicant: NIKON CORPORATION, Tokyo (JP)

(72) Inventor: Osamu Tanitsu, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 13/866,447

(22) Filed: Apr. 19, 2013

(65) Prior Publication Data

US 2013/0229639 A1    Sep. 5, 2013

Related U.S. Application Data

(62) Division of application No. 12/191,821, filed on Aug. 14, 2008, now Pat. No. 8,451,427.

(60) Provisional application No. 61/071,949, filed on May 27, 2008, provisional application No. 60/960,085, filed on Sep. 14, 2007.

(51) Int. Cl.
   *G03B 27/32*    (2006.01)
   *G03B 27/42*    (2006.01)
   (Continued)

(52) U.S. Cl.
   CPC ........ *G03F 7/70058* (2013.01); *G03F 7/70108* (2013.01); *G03F 7/70116* (2013.01);
   (Continued)

(58) Field of Classification Search
   CPC ... G03F 7/70; G03F 7/70058; G03F 7/70091; G03F 7/70108; G03F 7/70116

USPC .......................... 355/53, 67, 71, 77; 359/290
See application file for complete search history.

(56) References Cited

U.S. PATENT DOCUMENTS

| | | | |
|---|---|---|---|
| 4,295,735 A | 10/1981 | Lacombat et al. | |
| 4,346,164 A | 8/1982 | Tabarelli et al. | |

(Continued)

FOREIGN PATENT DOCUMENTS

| | | | |
|---|---|---|---|
| CN | 1461973 A | 12/2003 | |
| CN | 1501175 A | 6/2004 | |

(Continued)

OTHER PUBLICATIONS

Mar. 12, 2013 Office Action issued in Chinese Patent Application No. 200880024806.7 (with translation).

(Continued)

*Primary Examiner* — Colin Kreutzer
(74) *Attorney, Agent, or Firm* — Oliff PLC

(57) ABSTRACT

An illumination optical system which illuminates a surface to be illuminated on the basis of light from a light source has a first optical path in which a diffractive optical element can be arranged at a first position thereof; a second optical path in which a spatial light modulator with a plurality of optical elements arrayed two-dimensionally and controlled individually can be arranged at a second position thereof; and a third optical path which is an optical path of light having passed via at least one of the first optical path and the second optical path and in which a distribution forming optical system is arranged. The distribution forming optical system forms a predetermined light intensity distribution on an illumination pupil located in the third optical path, based on the light having passed via at least one of the first and second optical paths.

10 Claims, 11 Drawing Sheets

(51) Int. Cl.
  *G03B 27/54* (2006.01)
  *G03B 27/72* (2006.01)
  *G03F 7/20* (2006.01)
  *G02B 26/00* (2006.01)
  *G02B 26/02* (2006.01)
  *G02B 27/09* (2006.01)

(52) U.S. Cl.
  CPC ........ *G03F 7/70141* (2013.01); *G03F 7/70158* (2013.01); *G02B 26/00* (2013.01); *G02B 26/02* (2013.01); *G02B 27/0927* (2013.01)

(56) References Cited

U.S. PATENT DOCUMENTS

| | | | |
|---|---|---|---|
| 5,153,428 A | 10/1992 | Ellis | |
| 5,216,541 A | 6/1993 | Takesue et al. | |
| 5,229,872 A | 7/1993 | Mumola | |
| 5,251,222 A | 10/1993 | Hester et al. | |
| 5,312,513 A | 5/1994 | Florence et al. | |
| 5,383,000 A | 1/1995 | Michaloski et al. | |
| 5,461,410 A | 10/1995 | Venkateswar et al. | |
| 5,850,300 A | 12/1998 | Kathman et al. | |
| 5,850,310 A | 12/1998 | Schweizer | |
| 5,991,009 A | 11/1999 | Nishi et al. | |
| 6,198,576 B1 | 3/2001 | Matsuyama | |
| 6,406,148 B1 | 6/2002 | Marshall et al. | |
| 6,466,304 B1 | 10/2002 | Smith | |
| 6,577,379 B1 | 6/2003 | Boettiger et al. | |
| 6,577,429 B1 | 6/2003 | Kurtz et al. | |
| 6,665,119 B1 | 12/2003 | Kurtz et al. | |
| 6,737,662 B2 | 5/2004 | Mulder et al. | |
| 6,819,490 B2 | 11/2004 | Sandstrom et al. | |
| 6,829,090 B2 | 12/2004 | Katsumata et al. | |
| 6,844,927 B2 | 1/2005 | Stokowski et al. | |
| 6,885,493 B2 | 4/2005 | Ljungblad et al. | |
| 6,891,655 B2 | 5/2005 | Grebinski et al. | |
| 6,900,827 B2 | 5/2005 | Taniguchi | |
| 6,900,915 B2 | 5/2005 | Nanjyo et al. | |
| 6,913,373 B2 | 7/2005 | Tanaka et al. | |
| 6,958,806 B2 | 10/2005 | Mulder et al. | |
| 6,958,867 B2 | 10/2005 | Ohmori et al. | |
| 6,960,035 B2 | 11/2005 | Okazaki et al. | |
| 6,961,116 B2 | 11/2005 | Den Boef et al. | |
| 6,977,718 B1 | 12/2005 | LaFontaine | |
| 7,015,491 B2 | 3/2006 | Eurlings et al. | |
| 7,030,962 B2 | 4/2006 | Iizuka et al. | |
| 7,061,226 B2 | 6/2006 | Dürr | |
| 7,088,426 B2 | 8/2006 | Hirukawa et al. | |
| 7,095,481 B2 | 8/2006 | Morohoshi | |
| 7,095,546 B2 | 8/2006 | Mala et al. | |
| 7,095,921 B2 | 8/2006 | Okazaki et al. | |
| 7,102,731 B2 | 9/2006 | Hirukawa et al. | |
| 7,116,403 B2 | 10/2006 | Troost et al. | |
| 7,121,740 B2 | 10/2006 | Okazaki et al. | |
| 7,130,021 B2 | 10/2006 | Kobayashi | |
| 7,130,120 B2 | 10/2006 | Katsumata et al. | |
| 7,148,952 B2 | 12/2006 | Eurlings et al. | |
| 7,177,012 B2 | 2/2007 | Bleeker et al. | |
| 7,193,684 B2 | 3/2007 | Iizuka et al. | |
| 7,209,292 B2 | 4/2007 | Epple et al. | |
| 7,215,478 B1 | 5/2007 | Hirata | |
| 7,259,827 B2 | 8/2007 | Dierichs | |
| 7,289,276 B2 | 10/2007 | Ohmori et al. | |
| 7,400,382 B2 | 7/2008 | Baba-Ali et al. | |
| 7,423,731 B2 | 9/2008 | Tanitsu et al. | |
| 7,508,492 B2 | 3/2009 | Sekigawa et al. | |
| 7,525,642 B2 | 4/2009 | Mulder et al. | |
| 7,532,378 B2 | 5/2009 | Tanaka et al. | |
| 7,542,129 B2 | 6/2009 | Sandstrom | |
| 7,551,261 B2 | 6/2009 | Fiolka | |
| 7,573,052 B2 | 8/2009 | Inoue et al. | |
| 7,573,564 B2 | 8/2009 | Ruff et al. | |
| 7,580,559 B2 | 8/2009 | Latypov et al. | |
| 7,605,386 B2 | 10/2009 | Singer et al. | |
| 7,701,555 B2 | 4/2010 | Arai | |
| 7,714,983 B2 | 5/2010 | Koehler et al. | |
| 7,965,380 B2 | 6/2011 | Bleeker et al. | |
| 8,018,589 B2 | 9/2011 | Mackinnon et al. | |
| 2003/0038225 A1 | 2/2003 | Mulder et al. | |
| 2003/0071204 A1 | 4/2003 | Sandstrom et al. | |
| 2003/0098959 A1 | 5/2003 | Hagiwara et al. | |
| 2003/0214571 A1 | 11/2003 | Ishikawa et al. | |
| 2004/0053148 A1 | 3/2004 | Morohoshi et al. | |
| 2004/0057034 A1 | 3/2004 | Zinn et al. | |
| 2004/0100629 A1 | 5/2004 | Stokowski et al. | |
| 2004/0108467 A1 | 6/2004 | Eurlings et al. | |
| 2004/0160582 A1 | 8/2004 | Lof et al. | |
| 2004/0207386 A1 | 10/2004 | Durr | |
| 2005/0024612 A1 | 2/2005 | Hirukawa et al. | |
| 2005/0094122 A1 | 5/2005 | Hagiwara et al. | |
| 2005/0095749 A1 | 5/2005 | Krellmann et al. | |
| 2005/0141583 A1 | 6/2005 | Sandstrom | |
| 2005/0168790 A1 | 8/2005 | Latypov et al. | |
| 2005/0190435 A1 | 9/2005 | Shafer et al. | |
| 2005/0213068 A1 | 9/2005 | Ishii et al. | |
| 2005/0231703 A1 | 10/2005 | Kobayashi | |
| 2005/0270515 A1 | 12/2005 | Troost et al. | |
| 2005/0281516 A1 | 12/2005 | Okazaki et al. | |
| 2006/0050261 A1 | 3/2006 | Brotsack | |
| 2006/0055834 A1 | 3/2006 | Tanitsu et al. | |
| 2006/0114446 A1 | 6/2006 | Gui | |
| 2006/0138349 A1 | 6/2006 | Bleeker et al. | |
| 2006/0170901 A1 | 8/2006 | Tanitsu et al. | |
| 2006/0175556 A1 | 8/2006 | Yabuki | |
| 2006/0176452 A1 | 8/2006 | Kim et al. | |
| 2006/0203214 A1 | 9/2006 | Shiraishi | |
| 2006/0227306 A1 | 10/2006 | Hirukawa et al. | |
| 2006/0232841 A1 | 10/2006 | Toishi et al. | |
| 2006/0245033 A1 | 11/2006 | Baba-Ali et al. | |
| 2007/0013888 A1 | 1/2007 | Flagello et al. | |
| 2007/0146676 A1 | 6/2007 | Tanisu et al. | |
| 2007/0165202 A1 | 7/2007 | Koehler et al. | |
| 2007/0195305 A1 | 8/2007 | Mulder et al. | |
| 2007/0201338 A1 | 8/2007 | Yaoita et al. | |
| 2007/0273853 A1 | 11/2007 | Bleeker et al. | |
| 2007/0296936 A1 | 12/2007 | Kato et al. | |
| 2008/0013065 A1* | 1/2008 | Kohl ............................... 355/67 |
| 2008/0021948 A1 | 1/2008 | Wilson et al. | |
| 2008/0030707 A1 | 2/2008 | Tanaka et al. | |
| 2008/0074746 A1 | 3/2008 | Cumme | |
| 2008/0079930 A1 | 4/2008 | Klarenbeek | |
| 2008/0095531 A1 | 4/2008 | Yeo et al. | |
| 2008/0239268 A1 | 10/2008 | Mulder et al. | |
| 2008/0259304 A1 | 10/2008 | Dierichs | |
| 2009/0021656 A1 | 1/2009 | Ozaki | |
| 2009/0033902 A1 | 2/2009 | Mulder et al. | |
| 2009/0073411 A1 | 3/2009 | Tanitsu | |
| 2009/0091730 A1 | 4/2009 | Tanaka | |
| 2009/0097007 A1 | 4/2009 | Tanaka | |
| 2009/0097094 A1 | 4/2009 | Tanaka | |
| 2009/0109417 A1 | 4/2009 | Tanitsu | |
| 2009/0128886 A1 | 5/2009 | Hirota | |
| 2009/0147247 A1 | 6/2009 | Endo et al. | |
| 2009/0174877 A1 | 7/2009 | Mulder et al. | |
| 2009/0185154 A1 | 7/2009 | Tanitsu | |
| 2009/0263736 A1 | 10/2009 | Inoue et al. | |
| 2010/0195077 A1 | 8/2010 | Koehler et al. | |
| 2012/0202157 A1 | 8/2012 | Tanitsu | |
| 2012/0236284 A1 | 9/2012 | Tanaka | |

FOREIGN PATENT DOCUMENTS

| | | |
|---|---|---|
| CN | 1573571 A | 2/2005 |
| CN | 1601322 A | 3/2005 |
| CN | 1879062 A | 12/2006 |
| DE | 206 607 | 2/1984 |
| DE | 221 563 A1 | 4/1985 |
| DE | 224 448 A1 | 7/1985 |
| DE | 242 880 A1 | 2/1987 |
| DE | 196 35 792 A1 | 4/1997 |
| DE | 100 29 938 A1 | 7/2001 |
| DE | 103 43 333 A1 | 4/2005 |
| EP | 0 023 231 A1 | 2/1981 |

(56) References Cited

FOREIGN PATENT DOCUMENTS

| | | |
|---|---|---|
| EP | 0 208 552 A2 | 1/1987 |
| EP | 0 656 555 A1 | 6/1995 |
| EP | 0 764 858 A2 | 3/1997 |
| EP | 0 779 530 A1 | 6/1997 |
| EP | 1 109 067 A | 6/2001 |
| EP | 1 211 561 A2 | 6/2002 |
| EP | 1 262 836 A1 | 12/2002 |
| EP | 1 280 007 A2 | 1/2003 |
| EP | 1 367 442 A2 | 12/2003 |
| EP | 1 395 049 A1 | 3/2004 |
| EP | 1 489 462 A2 | 12/2004 |
| EP | 1 674 935 A2 | 6/2006 |
| EP | 1826616 | 2/2007 |
| EP | 1 798 758 A1 | 6/2007 |
| EP | 1 843 204 A1 | 10/2007 |
| EP | 1 882 895 A1 | 1/2008 |
| EP | 1 970 943 | 9/2008 |
| EP | 1 993 120 A1 | 11/2008 |
| FR | 2 474 708 | 7/1981 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258990 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-21314 | 1/1993 |
| JP | H-5-13292 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |
| JP | A-5-217840 | 8/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |

(56) References Cited

FOREIGN PATENT DOCUMENTS

| | | |
|---|---|---|
| JP | A-6-29204 | 2/1994 |
| JP | A-6-42918 | 2/1994 |
| JP | A-6-53120 | 2/1994 |
| JP | A-6-97269 | 4/1994 |
| JP | A-6-104167 | 4/1994 |
| JP | A-6-120110 | 4/1994 |
| JP | B2-6-29102 | 4/1994 |
| JP | A-6-6-36054 | 5/1994 |
| JP | A-6-124126 | 5/1994 |
| JP | A-6-124872 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A-6-204121 | 7/1994 |
| JP | A-6-229741 | 8/1994 |
| JP | A-6-241720 | 9/1994 |
| JP | A-6-244082 | 9/1994 |
| JP | A-6-267825 | 9/1994 |
| JP | A-6-283403 | 10/1994 |
| JP | A-06-291023 | 10/1994 |
| JP | A-6-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-7-69621 | 3/1995 |
| JP | A-7-92424 | 4/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-7-147223 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | A-8-288213 | 11/1996 |
| JP | A-8-297699 | 11/1996 |
| JP | A-08-313842 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-215208 | 9/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | A-10-294268 | 11/1998 |
| JP | A-10-303114 | 11/1998 |
| JP | A-10-340846 | 12/1998 |
| JP | A-11-3849 | 1/1999 |
| JP | A-11-3856 | 1/1999 |
| JP | A-11-8194 | 1/1999 |
| JP | A-11-14876 | 1/1999 |

(56) References Cited

FOREIGN PATENT DOCUMENTS

| | | |
|---|---|---|
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-121498 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-2861766 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-37201 | 1/2001 |
| JP | A-2001-44097 | 2/2001 |
| JP | A-2001-74240 | 3/2001 |
| JP | A-2001-82472 | 3/2001 |
| JP | A-2001-85307 | 3/2001 |
| JP | A-2001-97734 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | A-2002-66428 | 3/2002 |
| JP | A-2002-71513 | 3/2002 |
| JP | A-2002-75816 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |
| JP | A-2002-329651 | 11/2002 |
| JP | A-2002-334836 | 11/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-17003 | 1/2003 |
| JP | A-2003-17404 | 1/2003 |
| JP | A-2003-022967 | 1/2003 |
| JP | A-2003-28673 | 1/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59286 | 2/2003 |
| JP | A-2003-59803 | 2/2003 |
| JP | A-2003-59821 | 2/2003 |
| JP | A-2003-68600 | 3/2003 |
| JP | A-2003-75703 | 3/2003 |
| JP | A-2003-81654 | 3/2003 |

(56) References Cited

FOREIGN PATENT DOCUMENTS

| | | |
|---|---|---|
| JP | A-2003-84445 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-133201 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-195223 | 7/2003 |
| JP | A-2003-224961 | 8/2003 |
| JP | A-2003-229347 | 8/2003 |
| JP | A-2003-233001 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A-2003-279889 | 10/2003 |
| JP | A-2003-282423 | 10/2003 |
| JP | A-2003-297727 | 10/2003 |
| JP | A-2003-523281 | 10/2003 |
| JP | A-2003-532281 | 10/2003 |
| JP | A-2003-532282 | 10/2003 |
| JP | A-2003-311923 | 11/2003 |
| JP | A-2004-006440 | 1/2004 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-63847 | 2/2004 |
| JP | A-2004-71851 | 3/2004 |
| JP | A-2004-85612 | 3/2004 |
| JP | A-2004-87987 | 3/2004 |
| JP | A-2004-093624 | 3/2004 |
| JP | A-2004-95653 | 3/2004 |
| JP | U-3102327 | 3/2004 |
| JP | A-2001-23996 | 4/2004 |
| JP | A-2004-98012 | 4/2004 |
| JP | A-2004-101362 | 4/2004 |
| JP | A-2004-103674 | 4/2004 |
| JP | A-2004-103858 | 4/2004 |
| JP | A-2004-111569 | 4/2004 |
| JP | A-2004-111579 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | 2004-051717 A1 | 6/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-191660 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-206115 | 7/2004 |
| JP | A-2004-207696 | 7/2004 |
| JP | A-2004-207711 | 7/2004 |
| JP | A-2004-221253 | 8/2004 |
| JP | A-2004-224421 | 8/2004 |
| JP | A-2004-228497 | 8/2004 |
| JP | A-2004-233897 | 8/2004 |
| JP | A-2004-241666 | 8/2004 |
| JP | A-2004-247527 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004/304135 | 10/2004 |
| JP | A-2004-304135 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | 2004-104654 A1 | 12/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-11990 | 1/2005 |
| JP | A-2005-12228 | 1/2005 |
| JP | A-2005-018013 | 1/2005 |
| JP | A-2005-19628 | 1/2005 |
| JP | A-2005-19864 | 1/2005 |
| JP | A-2005-26634 | 1/2005 |
| JP | A-2005-503018 | 1/2005 |
| JP | A-2005-032909 | 2/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-93948 | 4/2005 |
| JP | A-2005-97057 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A-2005-136422 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |

(56) References Cited

FOREIGN PATENT DOCUMENTS

| | | |
|---|---|---|
| JP | A-2005-209705 | 8/2005 |
| JP | A-2005-209706 | 8/2005 |
| JP | A-2005-223328 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243870 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302825 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2005-537658 | 12/2005 |
| JP | A-2006-1821 | 1/2006 |
| JP | A-2006-5197 | 1/2006 |
| JP | A-2006-013518 | 1/2006 |
| JP | A-2006-17895 | 1/2006 |
| JP | A-2006-19702 | 1/2006 |
| JP | A-2006-24706 | 1/2006 |
| JP | A-2006-24819 | 1/2006 |
| JP | A-2006-32750 | 2/2006 |
| JP | A-2006-032963 | 2/2006 |
| JP | A-2006-41302 | 2/2006 |
| JP | A-2006/054328 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-508369 | 3/2006 |
| JP | A-2006-100363 | 4/2006 |
| JP | A-2006-100686 | 4/2006 |
| JP | A-2006-113437 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A-2006-135312 | 5/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-516724 | 7/2006 |
| JP | A-2006-228718 | 8/2006 |
| JP | A-2006-519494 | 8/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-284740 | 10/2006 |
| JP | A-2006-289684 | 10/2006 |
| JP | A-2006-309243 | 11/2006 |
| JP | A-2006-344747 | 12/2006 |
| JP | A-2006-349946 | 12/2006 |
| JP | A-2006-351586 | 12/2006 |
| JP | A-2007-5830 | 1/2007 |
| JP | A-2007-019079 | 1/2007 |
| JP | A-2007-43980 | 2/2007 |
| JP | A-2007-48819 | 2/2007 |
| JP | A-2007-51300 | 3/2007 |
| JP | A-2007-505488 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-150295 | 6/2007 |
| JP | A-2007-170938 | 7/2007 |
| JP | A-2007-187649 | 7/2007 |
| JP | A-2007-207821 | 8/2007 |
| JP | 2004-247527 | 9/2007 |
| JP | A-2007-227637 | 9/2007 |
| JP | A-2007-227918 | 9/2007 |
| JP | A-2007-235041 | 9/2007 |
| JP | A-2007-258691 | 10/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-047744 | 2/2008 |
| JP | A-2008-58580 | 3/2008 |
| JP | A-2008-64924 | 3/2008 |
| JP | A-2008-102134 | 5/2008 |
| JP | A-2008-103737 | 5/2008 |
| JP | A-2008-180492 | 8/2008 |
| JP | A-2008-258605 | 10/2008 |
| JP | A-2009-17540 | 1/2009 |
| JP | A-2009-60339 | 3/2009 |
| JP | A-2009-105396 | 5/2009 |
| JP | A-2009-111369 | 5/2009 |
| JP | A-2009-117801 | 5/2009 |
| JP | A-2009-117812 | 5/2009 |
| JP | A-2010-034486 | 2/2010 |
| JP | B-5141491 | 11/2012 |
| KR | 10-2002-0092207 | 12/2002 |
| KR | 10-2006-0118435 A | 11/2006 |
| KR | 10-2007-0087507 A | 8/2007 |
| TW | 497365 | 8/2002 |
| TW | 200400540 | 1/2004 |
| TW | I-267694 | 12/2006 |
| WO | WO 97/11411 A1 | 3/1997 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/11706 A1 | 3/2000 |
| WO | WO 00/67303 | 4/2000 |
| WO | WO 00/67303 | 11/2000 |
| WO | WO 01/03170 A1 | 1/2001 |
| WO | WO 01/10137 A1 | 2/2001 |
| WO | WO 01/22480 A1 | 3/2001 |
| WO | WO 01/27978 A1 | 4/2001 |
| WO | WO 01/59502 A1 | 8/2001 |
| WO | WO 01/65296 A1 | 9/2001 |
| WO | WO 02/16993 A1 | 2/2002 |
| WO | WO 02/063664 A1 | 8/2002 |
| WO | WO 02/069094 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/101804 A1 | 12/2002 |
| WO | WO 02/103766 A1 | 12/2002 |
| WO | WO 03/023832 A1 | 3/2003 |
| WO | WO 03/023833 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051717 A1 | 6/2004 |
| WO | WO 2004/053596 A2 | 6/2004 |
| WO | WO 2004/053950 A1 | 6/2004 |

(56) References Cited

FOREIGN PATENT DOCUMENTS

| | | |
|---|---|---|
| WO | WO 2004/053951 A1 | 6/2004 |
| WO | WO2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/071070 A2 | 8/2004 |
| WO | WO 2004/077164 A1 | 9/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/029559 A1 | 3/2005 |
| WO | WO 2005/036619 A1 | 4/2005 |
| WO | WO 2005/036620 A1 | 4/2005 |
| WO | WO 2005-036622 A1 | 4/2005 |
| WO | WO 2005-036623 A1 | 4/2005 |
| WO | WO 2005/041276 A1 | 5/2005 |
| WO | WO 2005/048325 A1 | 5/2005 |
| WO | WO 2005/048326 A1 | 5/2005 |
| WO | WO 2005/057636 A1 | 6/2005 |
| WO | WO 2005/067013 A1 | 7/2005 |
| WO | WO 2005/071717 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006-006730 A1 | 1/2006 |
| WO | WO 2006-016551 A1 | 2/2006 |
| WO | WO 2006/019124 A1 | 2/2006 |
| WO | WO 2006-025341 A1 | 3/2006 |
| WO | WO 2006-028188 A1 | 3/2006 |
| WO | WO 2006-030727 A1 | 3/2006 |
| WO | WO 2006/030910 A1 | 3/2006 |
| WO | WO 2006/035775 A1 | 4/2006 |
| WO | WO 2006/035775 A1 | 4/2006 |
| WO | WO 2006/049134 A1 | 5/2006 |
| WO | WO 2006/051909 A1 | 5/2006 |
| WO | WO 2006-064851 A1 | 6/2006 |
| WO | WO 2006/068233 A1 | 6/2006 |
| WO | WO 2006-077958 A1 | 7/2006 |
| WO | WO 2006/080285 | 8/2006 |
| WO | WO 2006/085524 A1 | 8/2006 |
| WO | WO 2006085626 A1 | 8/2006 |
| WO | 2006/097101 A | 9/2006 |
| WO | WO 2006/097135 A1 | 9/2006 |
| WO | WO 2006/100889 A1 | 9/2006 |
| WO | WO 2006-118108 A1 | 11/2006 |
| WO | WO 2006-343023 | 12/2006 |
| WO | WO 2007/003563 A1 | 1/2007 |
| WO | WO 2007/004567 A1 | 1/2007 |
| WO | WO 2007-018127 A1 | 2/2007 |
| WO | WO 2007/055237 A1 | 5/2007 |
| WO | WO 2007/055373 A1 | 5/2007 |
| WO | WO 2007/058188 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/100081 A1 | 9/2007 |
| WO | WO 2007/132862 A1 | 11/2007 |
| WO | WO 2007/141997 A1 | 12/2007 |
| WO | WO 2008/015973 A1 | 2/2008 |
| WO | WO 2008/041575 A1 | 4/2008 |
| WO | WO 2008/059748 A1 | 5/2008 |
| WO | WO 2008/061681 A2 | 5/2008 |
| WO | WO 2008/065977 A1 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/131928 | 11/2008 |
| WO | WO 2008/139848 A1 | 11/2008 |
| WO | WO 2009/026947 A1 | 3/2009 |
| WO | WO 2009/034109 A2 | 3/2009 |
| WO | WO 2009/054541 A2 | 4/2009 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Apr. 5, 2013 Notice of Allowance issued in U.S. Appl. No. 13/484,051.
Apr. 29, 2013 Notice of Allowance issued in U.S. Appl. No. 12/252,274.
May 14, 2013 Office Action issued in Japanese Patent Application No. P2010-506474 (with translation).
Nov. 15, 2011 Office Action issued in U.S. Appl. No. 12/252,274.
Dec. 8, 2011 Office Action issued in U.S. Appl. No. 12/256,055.
Nov. 3, 2011 issued in Chinese Patent Application No. 200880015567.9 (with translation).
Dec. 12, 2011 Office Action issued in European Patent Application No. 08 837 064.8.
Nov. 17, 2011 Office Action issued in Chinese Patent Application No. 200880024375.4 (with translation).
Dec. 15, 2011 Notice of Allowance issued in U.S. Appl. No. 12/245,021.
Dec. 20, 2011 Office Action issued in Chinese Application No. 200980101546.3 (with translation).
Jul. 26, 2011 Office Action issued in Chinese Patent Application No. 200880020867.6 (with translation).
Jul. 12, 2011 Office Action issued in Chinese Patent Application No. 200880018312.8 (with translation).
Jul. 28, 2011 Office Action issued in U.S. Appl. No. 12/252,283.
Jul. 5, 2011 Office Action issued in Chinese Patent Application No. 200880100940.0 (with translation).
Jun. 30, 2011 Office Action issued in Chinese Patent Application No. 200880021453.5 (with translation).
Nov. 7, 2011 Office Action issued in U.S. Appl. No. 12/250,519.
Nov. 28, 2011 Notice of Allowance issued in U.S. Appl. No. 12/952,197.
Gao, Y. et al., "Research on high-quality projecting reduction lithography system based on digital mask technique", Optik, WissenschaftlicheVerlag Gmbh. Stuttgart, vol. 116, No. 7, pp. 303-310, Aug. 2005.
Dec. 20, 2011 Office Action issued in Chinese Application No. 200980101546.3 (with English Translation).
Feb. 19, 2013 Office Action issued in Japanese Patent Application No. 2010-514429 (with English Translation).
Mar. 11, 2013 Office Action issued in European Patent Application No. 08847031.5.
Mar. 19, 2013 Office Action issued in European Patent Application No. 08830323.5.
Jan. 31, 2013 Office Action issued in Chinese Patent Application No. 200880021453.5 (with English Translation).
Jan. 15, 2013 Office Action issued in Japanese Patent Application No. 2008-259522 (with English Translation).
Jan. 23, 2013 Notice of Allowance issued in U.S. Appl. No. 12/952,197.
Jan. 23, 2013 Notice of Allowance issued in U.S. Appl. No. 12/252,283.
Jan. 16, 2013Notice of Allowance issued in U.S. Appl. No. 13/417,602.

(56) References Cited

OTHER PUBLICATIONS

Dec. 26, 2012 Office Action issued in Chinese Patent Application No. 200980101546.3 (with English Translation).
Dec. 18, 2012 Office Action issued in U.S. Appl. No. 12/250,519.
Jul. 27, 2012 Search Report issued in European Patent Application No. 12171299.6.
Sep. 21, 2012 Search Report issued in European Patent Application No. 12173801.7.
Oct. 23, 2012 Notice of Allowance issued in Japanese Patent Application No. 2008-263405 (with English Translation).
Feb. 22, 2012 Office Action issued in Chinese Patent Application No. 200880020867.6 (with English Translation).
May 9, 2012 Office Action issued in European Patent Application No. 08830323.5.
Aug. 24, 2012 Office Action issued in U.S. Appl. No. 12/245,021.
Aug. 27, 2012 Office Action issued in U.S. Appl. No. 12/256,055.
Jul. 26, 2012 Office Action issued in Chinese Patent Application No. 200880020867.6 (with English Translation).
Oct. 17, 2012 Office Action issued in European Patent Application No. 09 015 716.5.
Oct. 18, 2012 Search Report issued in European Patent Application No. 09 01 5718.1.
Jun. 20, 2012 Office Action issued in Chinese Patent Application No. 200880100940.0 (with English Translation).
Jul. 17, 2012 Office Action issued in U.S. Appl. No. 12/250,519.
Oct. 30, 2012 Search Report issued in European Patent Application No. 12173802.5.
Oct. 10, 2012 Office Action issued in Chinese Patent Application No. 200880015567.9 (with English Translation).
Jun. 18, 2012 Office Action issued in Chinese Patent Application No. 200880021453.5 (with English Translation).
Aug. 14, 2012 Notice of Allowance issued in U.S. Appl. No. 12/252,274.
Sep. 14, 2012 Office Action issued in U.S. Appl. No. 13/484,051.
Nov. 20, 2012 Office Action issued in Japanese Application No. P2008-261214 (w/translation).
Nov. 20, 2012 Office Action issued in Japanese Patent Application No. P2008-261215 (w/English Translation).
Nov. 27, 2012 Office Action issued in U.S. Appl. No. 12/252,274.
Sep. 28, 2012 Notice of Allowance issued in U.S. Appl. No. 12/252,283.
Oct. 2, 2012 Search Report issued in European Application No. 12173803.3.
Oct. 17, 2012 Search Report issued in European Application No. 08841021.2.
Jan. 15, 2009 International Search Report issued in International Application No. PCT/JP2008/068319.
Mar. 25, 2009 International Search Report issued in International Application No. PCT/JP2008/066803.
Jan. 16, 2009 Invitation to Pay Additional Fees Relating to the results of the Partial International Search Report issued in International Application No. PCT/JP2008/066803.
May 25, 2009 International Search Report issued in International Application No. PCT/JP2008/069704.
Mar. 6, 2009 Invitation to Pay Additional Fees Relating to the results of the Partial International Search Report issued in International Application No. PCT/JP2008/069704.
Jan. 26, 2009 International Search Report issued in International Application No. PCT/JP2008/068909.
Apr. 6, 2009 International Search Report issued in International Application No. PCT/JP2008/070253.
Mar. 2, 2009 International Search Report issued in International Application No. PCT/JP2008/069701.
Dec. 9, 2010 European Search Report issued in European Application No. 09015719.9.
Dec. 9, 2010 European Search Report issued in European Application No. 09015716.5.
Dec. 9, 2010 Partial European Search Report issued in European Application No. 09015718.1.

Oct. 15, 2010 Office Action issued in European Application No. 08 835 135.8.
Feb. 22, 2011 Office Action issued in European Application No. 08 830 323.5.
Dec. 8, 2010 Office Action issued in European Application No. 08 841 021.2.
Jun. 25, 2010 Office Action issued in European Application No. 08 837 064.8.
Mar. 24, 2011 Office Action issued in Chinese Application No. 200880024806.7 (with translation).
Feb. 20, 2012 Second Office Action issued in Chinese Patent Application No. 200880018312.8 (with translation).
May 18, 2011 Office Action issued in U.S. Appl. No. 12/208,155.
Jul. 27, 2011 Office Action issued in U.S. Appl. No. 12/208,155.
Aug. 26, 2011 Office Action issued in U.S. Appl. No. 12/245,021.
Jul. 18, 2011 Office Action issued in U.S. Appl. No. 12/250,519.
Jan. 3, 2011 Office Action issued in U.S. Appl. No. 12/262,930.
May 13, 2011 Office Action issued in U.S. Appl. No. 12/952,197.
Mar. 31, 2011 Notice of Allowance issued in U.S. Appl. No. 12/252,274.
Sep. 1, 2010 Office Action issued in U.S. Appl. No. 12/252,274.
Feb. 24, 2012 Notice of Allowance issued in U.S. Appl. No. 12/252,283.
Jul. 19, 2011 Office Action issued in U.S. Appl. No. 12/191,821.
Jan. 15, 2013 Notice of Allowance issued in U.S. Appl. No. 12/191,821.
May 23, 2012 Notice of Allowance issued in U.S. Appl. No. 12/191,821.
Feb. 7, 2012 Notice of Allowance issued in U.S. Appl. No. 12/191,821.
Jun. 17, 2013 Office Action issued in European Patent Application No. 12173802.5.
May 10, 2013 Office Action issued in European Patent Application No. 12171299.6.
Apr. 3, 2013 Office Action issued in Chinese Patent Application No. 200880100940.0 (with translation).
Nov. 19, 2013 Office Action issued in Japanese Patent Application No. P2012-080374 (with translation).
Nov. 22, 2013 Office Action issued in Taiwanese Patent Application No. 097135029 (with translation).
Jul. 16, 2013 Office Action issued in Japanese Patent Application No. P2008-226683 (with translation).
Jul. 29, 2013 Search Report issued in European Patent Application No. 13156736.4.
Oct. 11, 2013 Office Action issued in Chinese Patent Application No. 201110307567.X (with translation).
Nov. 5, 2013 Notice of Allowance issued in Japanese Patent Application No. P2008-226683 (with translation).
Aug. 14, 2007 Notice of Allowance issued in U.S. Appl. No. 11/583,934.
Jul. 9, 2009 Office Action issued in U.S. Appl. No. 11/907,797.
Feb. 23, 2010 Office Action issued in Japanese Patent Application No. P2005-515570 (with translation).
Aug. 3, 2010 Office Action issued in Japanese Patent Application No. P2005-515570 (with translation).
Aug. 3, 2010 Office Action issued in Japanese Patent Application No. P2006-262589 (with translation).
Aug. 3, 2010 Office Action issued in Japanese Patent Application No. P2006-553907.
Feb. 1, 2011 Office Action issued in Japanese Patent Application No. P2005-517637 (with translation).
May 29, 2012 Office Action issued in U.S. Appl. No. 13/417,602.
Feb. 1, 2011 Office Action issued in Japanese Patent Application No. P2006-262588 (with translation).
Feb. 1, 2011 Office Action issued in Japanese Patent Application No. P2006-262590 (with translation).
Dec. 24, 2013 Office Action issued in Taiwanese Patent Application No. 097140577 (with English Translation).
May 8, 2014 Office Action issued in counterpart European Patent Application No. 13156736.4.
Aug. 27, 2014 Office Action issued in Korean Application No. 10-2010-7011180 (with English translation).

(56) References Cited

OTHER PUBLICATIONS

Jul. 15, 2014 Office Action issued in Korean Patent Application No. 10-2010-7008059 (with English Translation).
Jul. 22, 2014 Office Action issued in Chinese Patent Application No. 201110307567.X (with English Translation).
Jul. 18, 2014 European Search Report issued in European Patent Application No. 12197226.9.
Jul. 18, 2014 European Search Report issued in European Patent Application No. 12197228.5.
Jul. 18, 2014 European Search Report issued in European Patent Application No. 12197227.7.
Aug. 27, 2014 Office Action issued in Korean Application No. 10-2010-7011180.
Nov. 26, 2014 Office Action issued in Korean Patent Application No. 10-2013-7027738.
Feb. 3, 2015 Search Report issued in European Patent Application No. 13156736.4.
Jan. 23, 2015 Office Action issued in Taiwanese Patent Application No. 101144123.

* cited by examiner ents of the spatial light modulator are
ILLUMINATION OPTICAL SYSTEM, EXPOSURE APPARATUS, OPTICAL ELEMENT AND MANUFACTURING METHOD THEREOF, AND DEVICE MANUFACTURING METHOD

CROSS-REFERENCE TO RELATED APPLICATIONS

This is a Division of U.S. application Ser. No. 12/191,821 filed Aug. 14, 2008, which claims the benefit of U.S. Provisional Application No. 60/960,085 filed Sep. 14, 2007 and U.S. Provisional Application No. 61/071,949 filed May 27, 2008. The disclosure of the prior applications is hereby incorporated by reference herein in its entirety.

BACKGROUND OF THE INVENTION

1. Field

An embodiment of the present invention relates to illumination optical systems, exposure apparatus, optical element and manufacturing method thereof, and device manufacturing methods.

2. Description of the Related Art

In a typical exposure apparatus of this type, a light beam emitted from a light source is guided through a fly's eye lens as an optical integrator to form a secondary light source (generally, a predetermined light intensity distribution on an illumination pupil) as a substantial surface illuminant consisting of a large number of light sources. The light intensity distribution on the illumination pupil will be referred to hereinafter as an "illumination pupil luminance distribution." The illumination pupil is defined as follows: by action of an optical system between the illumination pupil and a surface to be illuminated (which is a mask or wafer in the case of an exposure apparatus), the surface to be illuminated is kept as a Fourier transform plane of the illumination pupil.

Beams from the secondary light source are condensed by a condenser lens to superposedly illuminate a mask on which a predetermined pattern is formed. Light transmitted by the mask travels through a projection optical system to be focused on a wafer. In this manner, the mask pattern is projected (or transferred) to effect an exposure thereof on the wafer. The pattern formed on the mask is a highly integrated one and this microscopic pattern can be accurately transferred onto the wafer by obtaining a uniform illuminance distribution on the wafer.

There is a conventionally proposed illumination optical apparatus capable of continuously changing the illumination pupil luminance distribution (and, in turn, an illumination condition) (cf. Japanese Patent Application Laid-open No. 2002-353105).

SUMMARY

An embodiment of the present invention provides an illumination optical system capable of realizing a diversity of illumination conditions and capable of achieving an improvement in productivity of devices when applied to an exposure apparatus. An embodiment of the present invention provides an exposure apparatus capable of performing a good exposure under an appropriate illumination condition realized according to pattern characteristics, using the illumination optical system capable of realizing a diversity of illumination conditions.

An embodiment of the present invention provides an optical element used with an illumination optical system, which can realize an appropriate illumination condition according to pattern characteristics, for example, when applied to an exposure apparatus, and which can achieve an improvement in productivity of devices.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides an illumination optical system which illuminates a surface to be illuminated on the basis of light from a light source, the illumination optical system comprising: a first optical path in which a diffractive optical element can be arranged at a first position thereof; a second optical path in which a spatial light modulator with a plurality of optical elements arrayed two-dimensionally and controlled individually can be arranged at a second position thereof; and a third optical path which is an optical path of light having passed via at least one of the first optical path and the second optical path and in which a distribution forming optical system is arranged; wherein the distribution forming optical system forms a predetermined light intensity distribution on an illumination pupil located in the third optical path, based on the light having passed via at least one of the first and second optical paths.

A second embodiment of the present invention provides an illumination optical system which illuminates a surface to be illuminated on the basis of light from a light source, the illumination optical system comprising: a spatial light modulator with a plurality of optical elements arrayed two-dimensionally and controlled individually; and a distribution forming optical system which forms a predetermined light intensity distribution on an illumination pupil, based on light having passed via the spatial light modulator; wherein the plurality of optical elem selectively located between a position in an optical path of the illumination optical system and a position off the optical path of the illumination optical system.

A third embodiment of the present invention provides an illumination optical system which illuminates a surface to be illuminated on the basis of light from a light source, the illumination optical system comprising: a diffractive optical element which can be inserted at a first position in an optical path of the illumination optical system; a spatial light modulator with a plurality of optical elements arrayed two-dimensionally and controlled individually, which can be inserted at the first position or at a second position optically conjugate with the first position; and a distribution forming optical system which forms a predetermined light intensity distribution on an illumination pupil, based on light having passed via at least one of the diffractive optical element and the spatial light modulator.

A fourth embodiment of the present invention provides an exposure apparatus comprising the illumination optical system of any one of the first embodiment to the third embodiment for illuminating a predetermined pattern, the exposure apparatus performing an exposure of the predetermined pattern on a photosensitive substrate.

A fifth embodiment of the present invention provides a method for manufacturing an optical element for forming a predetermined illumination pupil luminance distribution on the basis of light from a light source, the optical element being applied to an exposure apparatus performing an exposure of a predetermined pattern on a substrate with light from the predetermined illumination pupil luminance distribution, the method comprising: a first step in which the predetermined pattern is set in the exposure apparatus; a second step in which the light from the light source is modulated by a spatial light modulator, for forming a required illumination pupil luminance distribution; a third step in which the exposure of the predetermined pattern set in the exposure apparatus is effected on the substrate, based on the light modulated by the spatial light modulator; a fourth step in which an exposed pattern exposed on the substrate is measured; a fifth step in which the illumination pupil luminance distribution is adjusted based on the exposed pattern measured in the fourth step; and a sixth step in which the optical element is manufactured based on information of the illumination pupil luminance distribution used in the exposure of the exposed pattern.

A sixth embodiment of the present invention provides an exposure apparatus comprising an illumination optical system for illuminating a predetermined pattern with illumination light having passed via the optical element of the fifth embodiment, the exposure apparatus performing the exposure of the predetermined pattern on a photosensitive substrate.

A seventh embodiment of the present invention provides a device manufacturing method comprising: effecting the exposure of the predetermined pattern on the photosensitive substrate, using the exposure apparatus of the sixth embodiment; developing the photosensitive substrate to which the pattern has been transferred, to form a mask layer in a shape corresponding to the pattern, on a surface of the photosensitive substrate; and processing the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION

Figure 1:
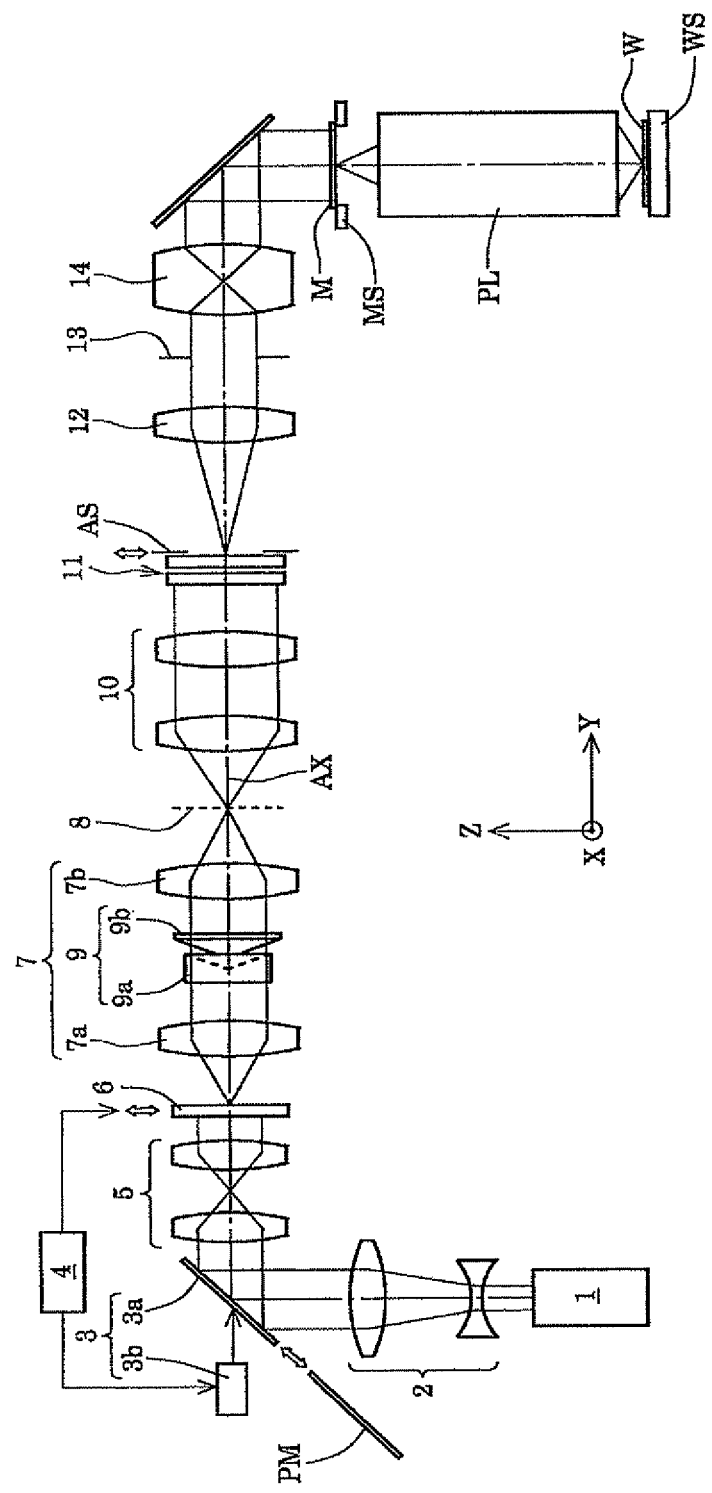
FIG. 1 is a drawing schematically showing a configuration of an exposure apparatus according to an embodiment of the present invention.

Embodiments of the present invention will be described on the basis of the accompanying drawings. FIG. 1 is a drawing schematically showing a configuration of an exposure apparatus according to an embodiment of the present invention. In FIG. 1, the Z-axis is set along a direction of a normal to a wafer W being a photosensitive substrate, the Y-axis along a direction parallel to the plane of FIG. 1 in a surface of the wafer W, and the X-axis along a direction normal to the plane of FIG. 1 in the surface of the wafer W. With reference to FIG. 1, exposure light (illumination light) from a light source 1 is supplied to the exposure apparatus of the present embodiment.

The light source 1 applicable herein can be, for example, an ArF excimer laser light source which supplies light with the wavelength of 193 nm or a KrF excimer laser light source which supplies light with the wavelength of 248 nm. The light emitted from the light source 1 is expanded into a light beam of a required sectional shape by a shaping optical system 2 and the expanded beam is incident to a spatial light modulator 3. The spatial light modulator 3 has a plurality of mirror elements (generally, optical elements) 3a arrayed two-dimensionally, and a driving unit 3b which individually controls and drives postures of the plurality of mirror elements 3a. The driving unit 3b individually controls and drives the postures of the mirror elements 3a, according to a command from a control unit 4. The configuration and action of the spatial light modulator 3 will be described later.

The spatial light modulator 3 is configured so that it can be inserted into or retracted from an illumination optical path and is replaceable with a plane mirror (or a prism mirror) PM. Insertion/retraction of the spatial light modulator 3 and the plane mirror PM into or from the illumination optical path is performed according to a command from the control unit 4. Light reflected on the spatial light modulator 3 or on the plane mirror PM travels via a relay optical system 5 and a diffractive optical element 6 to enter an afocal lens 7. The diffractive optical element 6 is configured so that it can be inserted into or retracted from the illumination optical path and is configured to be replaceable with another diffractive optical element which forms a different light intensity distribution in its far field. Insertion/retraction of the diffractive optical element 6 into or from the illumination optical path is performed according to a command from the control unit 4.

In general, a diffractive optical element is made by forming level differences with a pitch nearly equal to the wavelength of the exposure light (illumination light) in a substrate, and has an action to diffract an incident beam at desired angles. For easier understanding of the basic operation of the exposure apparatus, it is assumed hereinafter that the plane mirror PM is arranged instead of the spatial light modulator 3 in the illumination optical path and that a diffractive optical element for annular illumination is arranged as the diffractive optical element 6. The relay optical system 5 is configured so that the position where the plane mirror PM or the spatial light modulator 3 is located (precisely, the position where the reflecting surface of the plane mirror PM or the spatial light modulator 3 intersects with the optical axis AX) becomes optically conjugate with the position where the diffractive optical element 6 is located (precisely, the position of a diffracting surface of the diffractive optical element 6).

The diffractive optical element 6 for annular illumination has such a function that when a parallel beam with a rectangular cross section is incident thereto, it divides the wavefront of this beam and forms an annular light intensity distribution in its far field (or Fraunhofer diffraction region). The afocal lens 7 is an afocal system (afocal optic) so set that a front focal point thereof is approximately coincident with the position of the diffractive optical element 6 and that a rear focal point thereof is approximately coincident with a position of a predetermined plane 8 indicated by a dashed line in the drawing. Therefore, the nearly parallel beam incident to the diffractive optical element 6 forms an annular light intensity distribution on the pupil plane of the afocal lens 7 and light is then emitted in an annular angle distribution from the afocal lens 7.

A conical axicon system 9 is arranged at the position of the pupil plane of the afocal lens or at a position near it in the optical path between a front lens unit 7a and a rear lens unit 7b of the afocal lens 7. The configuration and action of the conical axicon system 9 will be described later. The beam having passed through the afocal lens 7 travels through a zoom lens 10 for variation in σ value (σ value=mask-side numerical aperture of an illumination optical apparatus/a mask-side numerical aperture of a projection optical system) to enter a cylindrical micro fly's eye lens 11.

Figure 2:
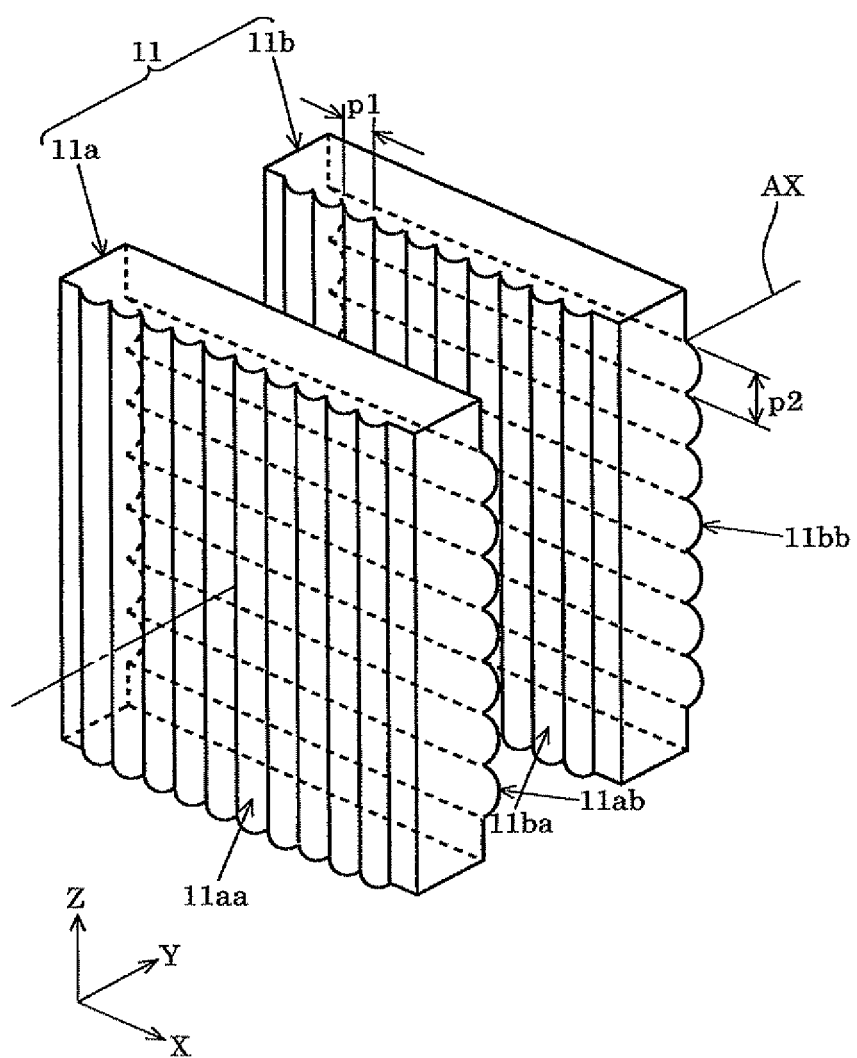
FIG. 2 is a perspective view schematically showing a configuration of a cylindrical micro fly's eye lens.

The cylindrical micro fly's eye lens 11, as shown in FIG. 2, is composed of a first fly's eye member 11a arranged on the light source side and a second fly's eye member 11b arranged on the mask side. Cylindrical lens groups 11aa and 11ba arrayed in juxtaposition in the X-direction are formed each at a pitch p1 in the light-source-side surface of the first fly's eye member 11a and in the light-source-side surface of the second fly's eye member 11b, respectively.

On the other hand, cylindrical lens groups 11ab and 11bb arrayed in juxtaposition in the Z-direction are formed each at a pitch p2 (p2>p1) in the mask-side surface of the first fly's eye member 11a and in the mask-side surface of the second fly's eye member 11b, respectively. When attention is focused on refracting action in the X-direction of the cylindrical micro fly's eye lens 11 (i.e., refraction in the XY plane), a parallel beam incident along the optical axis AX is subjected to wavefront division at the pitch p1 along the X-direction by the cylindrical lens group 11aa formed on the light source side of the first fly's eye member 11a, and then to condensing action of refracting faces thereof. Thereafter, the divided beams are subjected to condensing action of refracting faces of corresponding cylindrical lenses in the cylindrical lens group 11ba formed on the light source side of the second fly's eye member 11b, to be converged on the rear focal plane of the cylindrical micro fly's eye lens 11.

On the other hand, when attention is focused on refracting action in the Z-direction of the cylindrical micro fly's eye lens 11 (i.e., refraction in the YZ plane), a parallel beam incident along the optical axis AX is subjected to wavefront division at the pitch p2 along the Z-direction by the cylindrical lens group 11ab formed on the mask side of the first fly's eye member 11a, and the divided beams are then subjected to condensing action of refracting faces thereof. Thereafter, the beams are subjected to condensing action of refracting faces of corresponding cylindrical lenses in the cylindrical lens group 11bb formed on the mask side of the second fly's eye member 11b, to be converged on the rear focal plane of the cylindrical micro fly's eye lens 11.

As described above, the cylindrical micro fly's eye lens 11 is composed of the first fly's eye member 11a and the second fly's eye member 11b in which the cylindrical lens groups are arranged on both side faces thereof, and exercises the same optical function as a micro fly's eye lens in which a large number of rectangular microscopic refracting faces with the size of p1 in the X-direction and the size of p2 in the Z-direction are integrally formed vertically and horizontally and densely. With the cylindrical micro fly's eye lens 11, it is feasible to hold down change in distortion due to variation in surface shape of the microscopic refracting faces and, for example, to lessen influence on an illuminance distribution from manufacturing errors of the large number of microscopic refracting faces integrally formed by etching.

The position of the predetermined plane 8 is located near the front focal point of the zoom lens 10 and the entrance surface of the cylindrical micro fly's eye lens 11 is arranged near the rear focal point of the zoom lens 10. In other words, the zoom lens 10 establishes a substantial Fourier transform relation between the predetermined plane 8 and the entrance surface of the cylindrical micro fly's eye lens 11 and, therefore, keeps the pupil plane of the afocal lens 7 approximately optically conjugate with the entrance surface of the cylindrical micro fly's eye lens 11.

Therefore, an annular illumination field centered on the optical axis AX, for example, is formed on the entrance surface of the cylindrical micro fly's eye lens 11 as on the pupil plane of the afocal lens 7. The overall shape of this annular illumination field similarly varies depending upon the focal length of the zoom lens 10. The rectangular microscopic refracting faces as wavefront division units in the cylindrical micro fly's eye lens 11 are of a rectangular shape similar to a shape of an illumination field to be formed on the mask M (and, therefore, similar to a shape of an exposure region to be formed on the wafer W).

The beam incident to the cylindrical micro fly's eye lens 11 is two-dimensionally divided to form a secondary light source with a light intensity distribution approximately identical with that of the illumination field formed by the incident beam, i.e., a secondary light source consisting of a substantial surface illuminant of an annular shape centered on the optical axis AX, on or near the rear focal plane of the cylindrical micro fly's eye lens 11 (therefore, on or near the illumination pupil). Beams from the secondary light source formed on or near the rear focal plane of the cylindrical micro fly's eye lens 11 are incident to an aperture stop AS arranged near it.

The aperture stop AS has an annular aperture (light transmitting portion) corresponding to the annular secondary light source formed on or near the rear focal plane of the cylindrical micro fly's eye lens 11. The aperture stop AS is configured so that it can be inserted into or retracted from the illumination optical path and configured so as to be switchable among a plurality of aperture stops with apertures of different sizes and shapes. A switching method among the aperture stops can be, for example, one of the well-known turret method and slide method. The aperture stop AS is located at a position approximately optically conjugate with an entrance pupil plane of a projection optical system PL described later, and defines a range of contribution of the secondary light source to illumination.

The light from the secondary light source limited by the aperture stop AS travels through a condenser optical system 12 to superposedly illuminate a mask blind 13. In this manner, a rectangular illumination field according to the shape and focal length of the rectangular microscopic refracting faces being wavefront division units of the cylindrical micro fly's eye lens 11 is formed on the mask blind 13 as an illumination field stop. Light having passed through a rectangular aperture (light transmitting portion) of the mask blind 13 is subjected to converging action of an imaging optical system 14 and thereafter superposedly illuminates the mask M on which a predetermined pattern is formed. Namely, the imaging optical system 14 forms an image of the rectangular aperture of the mask blind 13 on the mask M.

A beam transmitted by the mask M held on a mask stage MS travels through the projection optical system PL to form an image of the mask pattern on the wafer (photosensitive substrate) W held on a wafer stage WS. In this arrangement, by performing one-shot exposures or scanning exposures while two-dimensionally driving and controlling the wafer stage WS and, therefore, two-dimensionally driving and controlling the wafer W in the plane (XY plane) perpendicular to the optical axis AX of the projection optical system PL, the pattern of the mask M is successively transferred into each of exposure regions of the wafer W.

When the diffractive optical element 6 for annular illumination is replaced with another diffractive optical element having an appropriate characteristic, e.g., a diffractive optical element for multi-pole illumination (e.g., for dipole illumination, for quadrupole illumination, for octupole illumination, or the like) or a diffractive optical element for circular illumination as set in the illumination optical path, it is feasible to implement a variety of modified illuminations. A switching method among the diffractive optical elements can be, for example, one of the well-known turret method and slide method.

The conical axicon system 9 is composed of the following members in order from the light source side: first prism member 9a with a plane on the light source side and with a refracting surface of a concave conical shape on the mask side; second prism member 9b with a plane on the mask side and with a refracting surface of a convex conical shape on the light source side. The concave conical refracting surface of the first prism member 9a and the convex conical refracting surface of the second prism member 9b are complementarily formed so as to be able to butt each other. At least one of the first prism member 9a and the second prism member 9b is configured to be movable along the optical axis AX so that the spacing can be varied between the concave conical refracting surface of the first prism member 9a and the convex conical refracting surface of the second prism member 9b. For easier understanding, the action of the conical axicon system 9 and the action of the zoom lens 10 will be described below with focus on the annular secondary light source.

In a state in which the concave conical refracting surface of the first prism member 9a and the convex conical refracting surface of the second prism member 9b butt each other, the conical axicon system 9 functions as a plane-parallel plate and causes no effect on the annular secondary light source formed. However, as the spacing is increased between the concave conical refracting surface of the first prism member 9a and the convex conical refracting surface of the second prism member 9b, the outside diameter (inside diameter) of the annular secondary light source varies while keeping the width of the annular secondary light source (half of a difference between the outside diameter and the inside diameter of the annular secondary light source) constant. Namely, the increase in the spacing results in varying the annular ratio (inside diameter/outside diameter) and the size (outside diameter) of the annular secondary light source.

The zoom lens 10 has a function to similarly enlarge or reduce the overall shape of the annular secondary light source. For example, when the focal length of the zoom lens 10 is increased from a minimum value to a predetermined value, the overall shape of the annular secondary light source is similarly enlarged. In other words, the width and size (outside diameter) of the annular secondary light source both vary, without change in the annular ratio of the annular secondary light source, by the action of the zoom lens 10. In this manner, the annular ratio and size (outside diameter) of the annular secondary light source can be controlled by the actions of the conical axicon system 9 and the zoom lens 10.

In the present embodiment, the spatial light modulator 3 used herein is, for example, a spatial light modulator configured to continuously change orientations of mirror elements 3a arrayed two-dimensionally. The spatial light modulator of this type applicable herein can be selected, for example, from those disclosed in Japanese Patent Application Laid-open (Translation of PCT Application) No. 10-503300 and European Patent Publication EP 779530A corresponding thereto, Japanese Patent Application Laid-open No. 2004-78136 and U.S. Pat. No. 6,900,915 corresponding thereto, Japanese Patent Application Laid-open (Translation of PCT Application) No. 2006-524349 and U.S. Pat. No. 7,095,546 corresponding thereto, and Japanese Patent Application Laid-open No. 2006-113437. European Patent Publication EP 779530A, U.S. Pat. No. 6,900,915 and U.S. Pat. No. 7,095,546 are incorporated as references herein.

Figure 3:
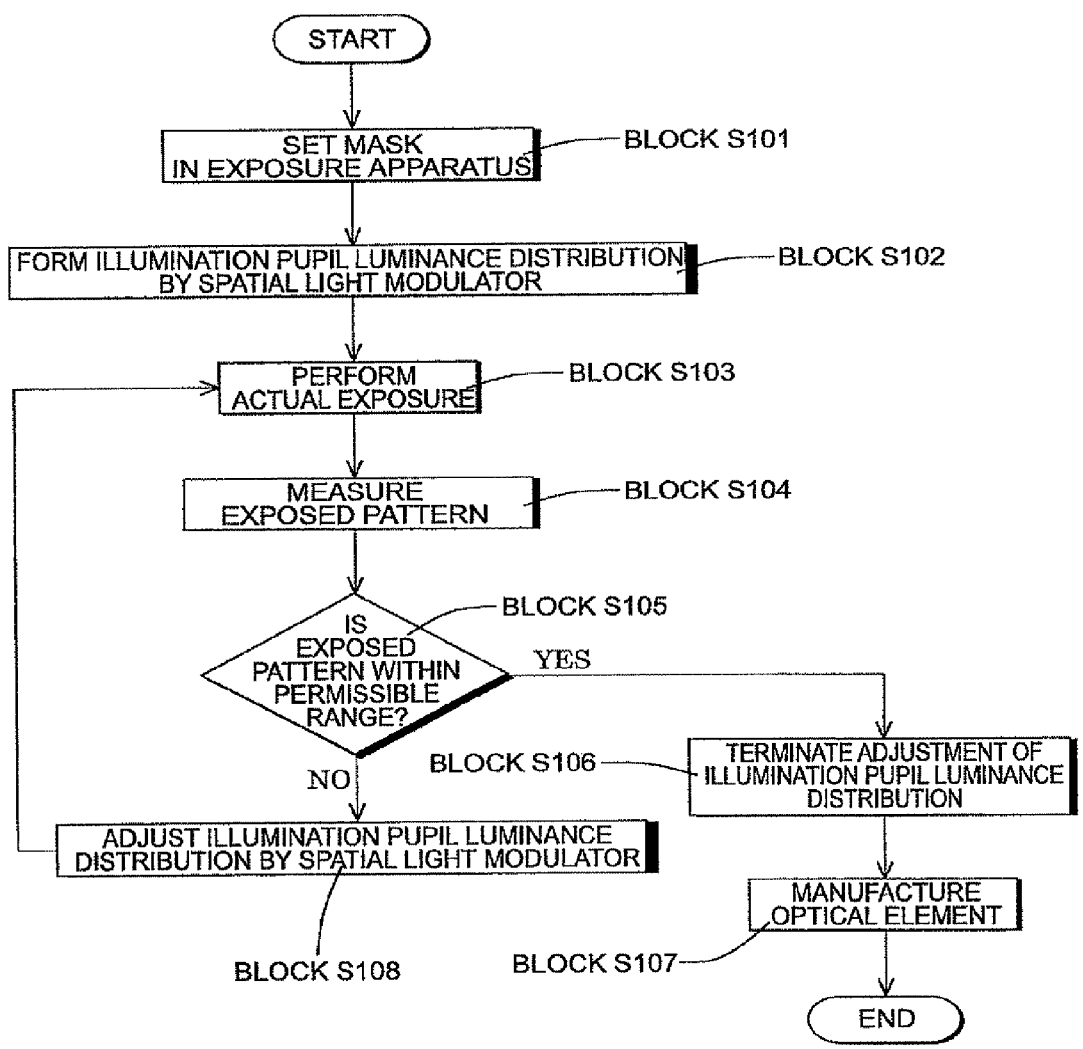
FIG. 3 is a flowchart showing manufacturing steps of an optical element according to an embodiment of the present invention.

An embodiment of a manufacturing method of a diffractive optical element will be described below with reference to FIG. 3. FIG. 3 is a flowchart showing blocks of manufacturing an optical element (diffractive optical element). As shown in FIG. 3, a mask M having a pattern for exposures of mass-produced devices is set in the exposure apparatus (block S101). In other words, the mask M with the pattern for exposures of mass-produced devices is mounted on the mask stage MS in the exposure apparatus. This pattern of the mask M may have an OPC pattern (pattern for Optical Proximity Correction) and does not always have to be a pattern approximately similar to a light pattern formed on an exposure surface (image plane).

Next, for adjusting the illumination pupil luminance distribution, i.e., for adjusting the illumination condition, prior to exposures for mass production of devices, the spatial light modulator 3 is inserted in place of the plane mirror PM in the illumination optical path and the diffractive optical element 6 is retracted from the illumination optical path. In the spatial light modulator 3, the postures of the mirror elements 3a each are changed according to a control signal from the control unit 4 so that the mirror elements 3a are set in respective predetermined orientations. Light beams reflected at respective predetermined angles by the mirror elements 3a of the spatial light modulator 3 form a light intensity distribution according to the control signal fed from the control unit 4 to the mirror elements 3a, on the pupil plane of the relay optical system 5.

The light forming the predetermined light intensity distribution on the pupil plane of the relay optical system 5 forms a similar light intensity distribution (or illumination pupil luminance distribution) on the pupil plane of the afocal lens 7, on the entrance surface of the cylindrical micro fly's eye lens 11, and on the rear focal plane of the cylindrical micro fly's eye lens 11 or on the illumination pupil (the position where the aperture stop AS is located) near it (block S102). Namely, the relay optical system 5, afocal lens 7, zoom lens 10, and cylindrical micro fly's eye lens 11 constitute a distribution forming optical system which forms the predetermined light intensity distribution on the illumination pupil on the basis of the light having passed via the spatial light modulator 3.

On the other hand, the afocal lens 7, zoom lens 10, and cylindrical micro fly's eye lens 11 constitute a distribution forming optical system which forms the predetermined light intensity distribution on the illumination pupil on the basis of the light having passed via the diffractive optical element 6. When the diffractive optical element 6 is used, the light intensity distribution or illumination pupil luminance distribution formed on the illumination pupil according to the diffraction pattern thereof is fixed. In contrast to it, when the spatial light modulator 3 is used the illumination pupil luminance distribution can be freely and quickly changed according to the control signal from the control unit 4 to the mirror elements 3a. Namely, the spatial light modulator 3 is similar to the diffractive optical element 6 in that it forms the predetermined light intensity distribution on the illumination pupil, but is different from the diffractive optical element 6 in that it variably forms the light intensity distribution on the illumination pupil.

For highly accurately and faithfully transferring the pattern of the mask M onto the wafer W, it is important for the exposure apparatus to perform the exposure under an appropriate illumination condition according to pattern characteristics and, especially, to find an appropriate illumination pupil luminance distribution according to the pattern characteristics. In the present embodiment, the appropriate illumination pupil luminance distribution according to the pattern characteristics of the mask M is quickly found by repeating actual exposures while changing the illumination pupil luminance distribution through the use of the spatial light modulator 3, in the state in which the spatial light modulator 3 is inserted instead of the plane mirror PM in the illumination optical path and in which the diffractive optical element 6 is retracted from the illumination optical path.

Specifically, in the state in which the spatial light modulator 3 is inserted in place of the plane mirror PM in the illumination optical path and in which the diffractive optical element 6 is retracted from the illumination optical path, the illumination pupil luminance distribution is formed using the spatial light modulator 3 and an actual exposure is performed on the wafer W coated with a resist (photosensitive material), with light from the illumination pupil luminance distribution (block S103).

Then the exposed wafer W is developed and the developed resist pattern is measured (block S104). This block S104 is configured to measure the developed resist pattern, but it is also possible to process the surface of the wafer W using the resist pattern as a hard mask and to measure a pattern on the processed wafer W. This processing includes, for example, at least one of etching of the surface of the wafer W and deposition of a metal film or the like.

Thereafter, it is determined whether the exposed pattern (at least one of the resist pattern and the pattern on the processed wafer W) is within a permissible range with respect to a real device pattern to be obtained (block S105). The permissible range herein may be defined as a permissible range of shape error between the real device pattern to be obtained and the exposed pattern. For determining the permissible range in consideration of errors and others during processing on the surface of the wafer W subsequent to effecting an exposure, the pattern on the processed wafer W may be used as the exposed pattern.

When it is determined in this block S105 that the exposed pattern is off the permissible range, the illumination pupil luminance distribution is adjusted by the spatial light modulator 3 and the flow moves to block S103 (block S108). Then the blocks S103-S105, and S108 are repeatedly carried out until the exposed pattern is determined to be within the permissible range.

When it is finally determined in block S105 that the exposed pattern is within the permissible range, the adjustment of the illumination pupil luminance distribution is terminated (block S106) and an optical element is manufactured based on the information of the illumination pupil luminance distribution used in the exposure of this exposed pattern within the permissible range (block S107). When the diffractive optical element is used as the optical element, the optical element can be manufactured, for example, according to the manufacturing method disclosed in U.S. Pat. No. 5,850,300 and U.S. Pat. Published Application No. 2008/0074746. U.S. Pat. No. 5,850,300 and U.S. Pat. Published Application No. 2008/0074746 are incorporated as references herein.

Then, as described above, the diffractive optical element 6 with the characteristic for formation of the appropriate illumination pupil luminance distribution found with the use of the spatial light modulator 3 is designed and manufactured and inserted in the illumination optical path, and, in the state in which the plane mirror PM is inserted in place of the spatial light modulator 3 in the illumination optical path, the exposures for mass production of devices are started. As a result, the time of transition from the adjustment of the illumination condition to the mass production of devices can be reduced by quickly determining the appropriate illumination pupil luminance distribution with the use of the spatial light modulator 3, and an improvement in productivity of devices can be achieved by performing the mass production of devices with the use of the diffractive optical element 6 having higher durability than the spatial light modulator 3. Incidentally, the design and manufacture of the diffractive optical element takes a considerable time and, therefore, a technique of finding the appropriate illumination pupil luminance distribution while switching among the diffractive optical elements with different characteristics takes a very long time for the transition from the adjustment of the illumination condition to the mass production of devices.

It is noted herein that the illumination optical path in which the diffractive optical element 6 can be arranged can be regarded as the first optical path and that the position where the diffractive optical element 6 can be inserted can be regarded as the first position. The "optical path" in the present specification is a path in which light is intended to pass in an operating state.

The illumination optical path in which the spatial light modulator 3 can be arranged can be regarded as the second optical path and the position where the spatial light modulator 3 can be inserted can be regarded as the second position. In the present embodiment, the second position is a position optically conjugate with the first position. The second position can be off from the position optically conjugate with the first position within a scope which is permissible from a practical viewpoint.

The illumination optical path in which the distribution forming optical system is arranged can be regarded as the third optical path. The third optical path can be an optical path of light having passed through at least one of the first optical path and the second optical path.

In the present embodiment, in all of the case where the spatial light modulator 3 is inserted and where the diffractive optical element 6 is retracted from the optical path, the case where the plane mirror PM is inserted instead of the spatial light modulator 3 and where the diffractive optical element 6 is inserted in the illumination optical path, and the case where the spatial light modulator 3 is inserted and where the diffractive optical element 6 is inserted, the optical path from the shaping optical system 2 to the front lens unit 7a of the afocal lens 7 can be regarded as the first optical path, the optical path from the shaping optical system 2 to the front lens unit 7a of the afocal lens 7 can be regarded as the second optical path, and the optical path of the optical system after the conical axicon system 9 can be regarded as the third optical path.

The plane mirror PM, as inserted into or refracted from the second position, can function as a selector that can select either one situation through switching between the case where the light from the light source is guided to the diffractive optical element 6 arranged in the first optical path and the case where the light from the light source 1 is guided to the spatial light modulator 3 arranged at the second position. Namely, the light from the light source 1 can be guided to the diffractive optical element 6 arranged in the first optical path, by inserting the plane mirror PM at the second position and retracting the spatial light modulator 3 from the second position. Alternatively, the light from the light source 1 can be guided to the spatial light modulator 3 arranged in the second optical path, by retracting the plane mirror PM from the second position and inserting the spatial light modulator 3 at the second position.

As described above, the illumination optical system (2-14) of the present embodiment is able to realize a diversity of illumination conditions and, when applied to the exposure apparatus, it is able to achieve an improvement in productivity of devices. The exposure apparatus (2-WS) of the present embodiment is able to perform the good exposure under the appropriate illumination condition realized according to the pattern characteristics of the mask M, using the illumination optical system (2-14) capable of realizing a diversity of illumination conditions, and, in turn, to manufacture good devices with high productivity. The exposure apparatus of the present embodiment is also able to perform a matching exposure with an old exposure apparatus, by adjusting the illumination pupil luminance distribution with the use of the spatial light modulator 3 and realizing an illumination condition approximately equal to a temporally changed illumination condition of the old exposure apparatus.

The present embodiment does not permit only the matching with the old exposure apparatus, but also permits matching between exposure apparatus of the same kind. Particularly, the present embodiment is effective to cases where the exposure apparatus of the same kind have different OPEs (Optical Proximity Effects). When the pattern of the mask M includes an OPC pattern (pattern for optical proximity correction), sensitivity of shape error of the exposed pattern tends to become high to an error of the illumination pupil luminance distribution; therefore, the technique of the present embodiment is particularly effective to such cases.

In the above description, the diffractive optical element 6 is inserted in the illumination optical path and the plane mirror PM is inserted in place of the spatial light modulator 3 in the illumination optical path, during mass production of devices. However, it is also possible to omit installation of the plane mirror PM and fixedly arrange the spatial light modulator 3 in the illumination optical path. In this case, the postures of the mirror elements 3a are adjusted so that the spatial light modulator 3 carries out the function of the plane mirror, during the mass production of devices. Alternatively, the postures of the mirror elements 3a are adjusted so as to form a required illumination pupil luminance distribution by convolution of the spatial light modulator 3 and the diffractive optical element 6, during the mass production of devices.

In the above description, the spatial light modulator 3 and the diffractive optical element 6 are configured so as to be arranged at optically conjugate positions with the relay optical system 5 in between. However, without having to be limited to this, it is also possible to adopt a configuration in which the position where the spatial light modulator 3 is arranged in the illumination optical path is coincided with the position where the diffractive optical element 6 is arranged in the illumination optical path. Specifically, it is also possible to adopt a configuration wherein the plane mirror PM is fixedly arranged in the illumination optical path and wherein, without installation of the relay optical system 5, either one of the spatial light modulator 3 and the diffractive optical element 6 is inserted at the position where the diffractive optical element 6 is located in FIG. 1. In this case, however, only either one of the spatial light modulator 3 and the diffractive optical element 6 is arranged in the illumination optical path, and, therefore, it is infeasible to form a required illumination pupil luminance distribution by convolution of the spatial light modulator 3 and the diffractive optical element 6.

In the above description, the spatial light modulator in which the orientations (inclinations) of the reflecting faces arrayed two-dimensionally can be individually controlled is used as the spatial light modulator with the plurality of optical elements arrayed two-dimensionally and controlled individually. However, without having to be limited to this, it is also possible, for example, to use a spatial light modulator in which heights (positions) of reflecting faces arrayed two-dimensionally can be individually controlled. The spatial light modulator of this type applicable herein can be, for example, one selected from those disclosed in Japanese Patent Application Laid-open No 6-281869 and U.S. Pat. No. 5,312,513 corresponding thereto, and FIG. 1d of Japanese Patent Application Laid-open (Translation of PCT Application) No. 2004-520618 and U.S. Pat. No. 6,885,493 corresponding thereto. These spatial light modulators are able to subject incident light to an action similar to that of a diffractive surface when a two-dimensional height distribution is formed therein. U.S. Pat. No. 5,312,513 and U.S. Pat. No. 6,885,493 are incorporated as references herein.

The aforementioned spatial light modulator with the plurality of reflecting faces arrayed two-dimensionally may be modified, for example, according to the disclosure in Japanese Patent Application Laid-open (Translation of PCT Application) No. 2006-513442 and U.S. Pat. No. 6,891,655 corresponding thereto, or according to the disclosure in Japanese Patent Application Laid-open (Translation of PCT Application) No. 2005-524112 and U.S. Pat. Published Application No. 2005/0095749 corresponding thereto. In the above description, the spatial light modulator used was the reflective spatial light modulator 3 with the plurality of mirror elements 3a, but, without having to be limited to this, it is also possible to use, for example, a transmissive spatial light modulator disclosed in U.S. Pat. Nos. 5,229,872, 5,229,872, 6,891,655, and U.S. Pat. Published Application No. 2005/0095749 are incorporated as references herein.

In the above-described embodiment the diffractive optical element 6 was considered as an optical element, but a refracting optical element which refracts an incident beam at desired angles to form a desired light intensity distribution in its far field may be considered as an optical element. This refracting optical element also has such a function that, for example, when a parallel beam with a rectangular cross section is incident thereto, it divides the wavefront of this beam and forms a desired (e.g., annular or multi-polar) light intensity distribution in its far field (or Fraunhofer diffraction region).

Since in the above-described embodiment the array surface of the mirror elements 3a forming the spatial light modulator 3 is arranged at 45° to the optical axis AX, the mirror elements 3a in the central region crossing the optical axis AX are arranged at the position conjugate with the diffractive optical element 6 through the relay optical system 5, but the mirror elements 3a other than those in the central region are displaced from the conjugate position with the diffractive optical element 6. In this case, a relatively dark optical system (optical system with low numerical aperture) may be used as the relay optical system 5, in order to lessen influence of the displacement of the mirror elements 3a from the conjugate position with the diffractive optical element 6, on formation of the illumination pupil luminance distribution.

Figure 4:
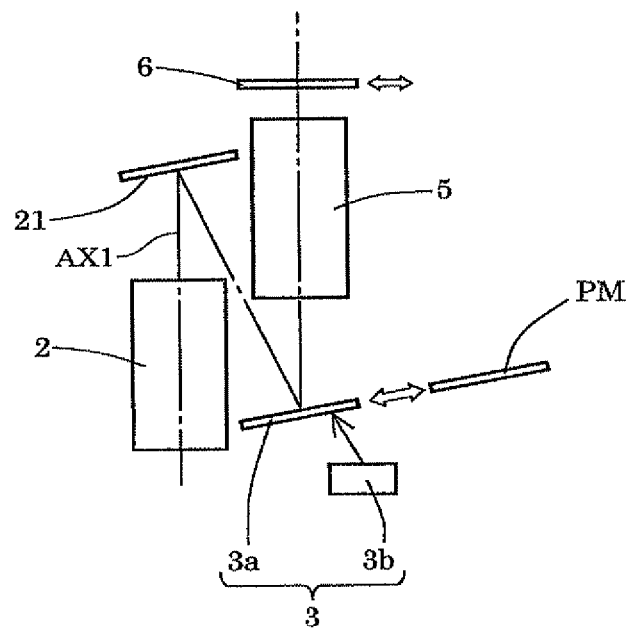
FIG. 4 is a drawing schematically showing a major configuration of a modification example in which a path folding reflecting mirror is additionally provided immediately before a spatial light modulator.

In a case where a relatively bright optical system (optical system with high numerical aperture) is used as the relay optical system 5, a path folding reflecting mirror 21 is additionally provided immediately before the spatial light modulator 3 as shown in FIG. 4, so that the angle of incidence of light to the plurality of mirror elements 3a forming the spatial light modulator 3 is kept not more than a predetermined angle, whereby the influence of the displacement of the mirror elements 3a of the spatial light modulator 3 can be kept down on the formation of the illumination pupil luminance distribution.

When the angle between the optical axis AX1 of the optical system located on the incidence side of the spatial light modulator 3 and a normal to the array surface of the mirror elements 3a of the spatial light modulator 3 is kept smaller than 45° as shown in FIG. 4, the incident light to the mirror elements 3a of the spatial light modulator 3 can be made closer to approximately perpendicular incidence. At this time, there is the advantage that the aspect ratio of the mirror elements 3a of the spatial light modulator 3 is not compressed or expanded when viewed from the optical system located on the exit side.

Figure 5:
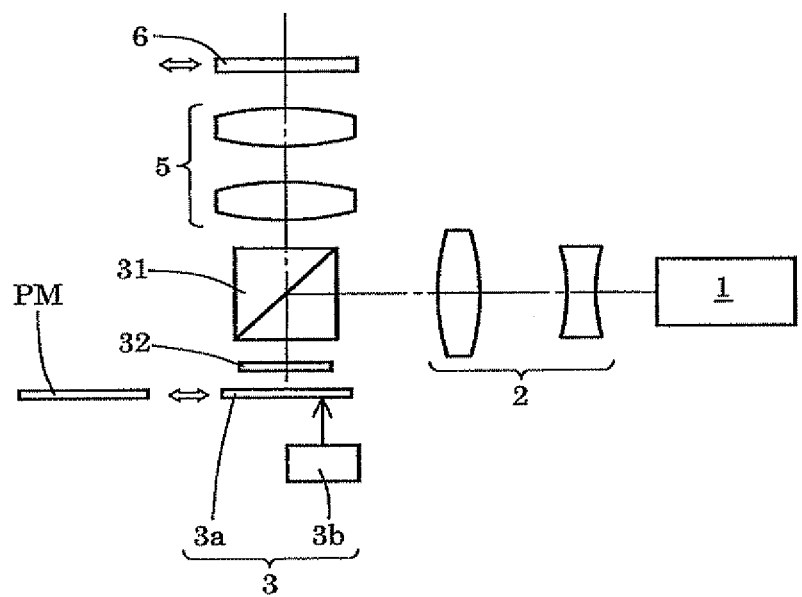
FIG. 5 is a drawing schematically showing a major configuration of a modification example in which a plurality of mirror elements of a spatial light modulator are arranged at 90° with respect to the optical axis.

In the above-described embodiment the plurality of mirror elements 3a forming the spatial light modulator 3 are arranged at 45° to the optical axis AX, but it is also possible to adopt a configuration wherein the array surface of the mirror elements 3a of the spatial light modulator 3 is arranged at 90° to the optical axis AX as shown in FIG. 5. In the modification example of FIG. 5 the optical system is provided with a polarization beam splitter 31 arranged in the optical path between the shaping optical system 2 and the spatial light modulator 3, and a quarter wave plate 32 arranged in the optical path between the polarization beam splitter 31 and the plurality of mirror elements 3a of the spatial light modulator 3.

Therefore, light incident in an s-polarized state for the polarization separation surface of the polarization beam splitter 31 through the shaping optical system 2 is reflected by the polarization beam splitter 31 and is converted into circularly polarized light by the quarter wave plate 32, and the circularly polarized light is incident to the plurality of mirror elements 3a of the spatial light modulator 3. The light in the circularly polarized state reflected by the mirror elements 3a of the spatial light modulator 3 is converted into p-polarized light by the quarter wave plate 32 and the p-polarized light is transmitted by the polarization beam splitter 31 to enter the relay optical system 5. The spatial light modulator 3 is configured to be replaceable with the plane mirror PM.

Since in the modification example of FIG. 5 the array surface of the mirror elements 3a of the spatial light modulator 3 is positioned so as to be perpendicular to the optical axis AX, all the mirror elements 3a are conjugate with the diffractive optical element 6 through the relay optical system 5. As a result, the modification example of FIG. 5, different from the embodiment of FIG. 1 and the modification example of FIG. 4, is free of the disadvantage that the displacement of the mirror elements 3a from the conjugate position with the diffractive optical element 6 affects the formation of the illumination pupil luminance distribution.

In the above-described embodiment and modification examples, the plane mirror PM is inserted at the position of the spatial light modulator 3. However, it is also possible to adopt a configuration wherein the spatial light modulator 3 is fixedly arranged and wherein the plane mirror PM is inserted immediately before the mirror elements 3a of the spatial light modulator, as shown in FIGS. 6A to 6C.

Figure 6A:
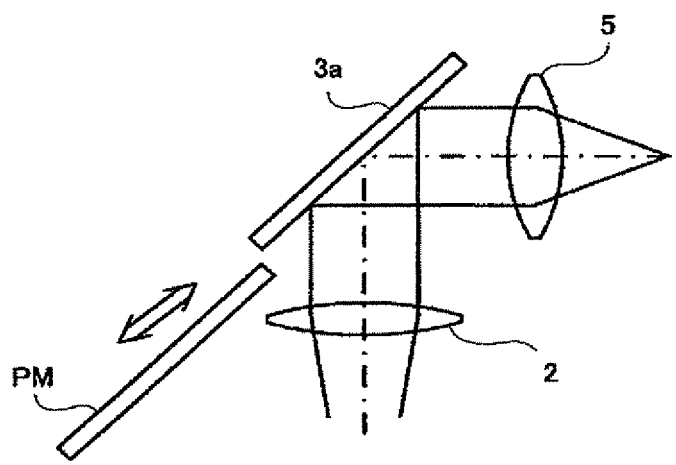
FIG. 6A is a drawing schematically showing major configurations of modification examples in which a plane mirror can be inserted immediately before a plurality of mirror elements of a spatial light modulator fixedly arranged.

FIG. 6A shows a modification example wherein the plane mirror PM is retractably provided in the entrance-side (exit-side) optical path of the mirror elements 3a of the spatial light modulator 3 in the embodiment of FIG. 1; FIG. 6B shows a modification example wherein the plane mirror PM is retractably provided in the entrance-side (exit-side) optical path of the mirror elements 3a of the spatial light modulator 3 in the modification example of FIG. 4; FIG. 6C shows a modification example wherein the plane mirror PM is retractably provided in the entrance-side (exit-side) optical path of the mirror elements 3a of the spatial light modulator 3 in the modification example of FIG. 5.

By fixedly arranging the spatial light modulator 3 and inserting the plane mirror PM immediately before the mirror elements 3a of the spatial light modulator as described above, the optical elements 3a of the spatial light modulator 3 can also be selectively located between the position in the optical path of the illumination optical system and the position off the optical path of the illumination optical system.

Figure 6B:
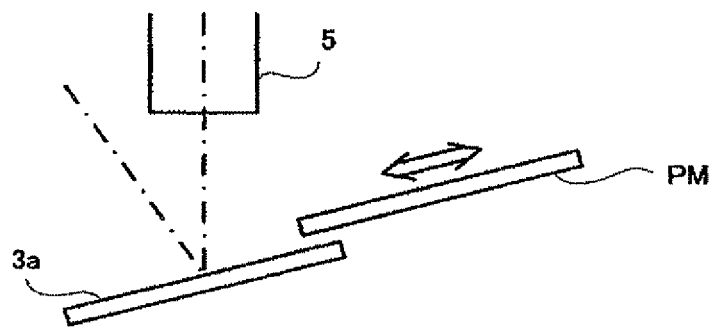
FIG. 6B is a drawing schematically showing major configurations of modification examples in which a plane mirror can be inserted immediately before a plurality of mirror elements of a spatial light modulator fixedly arranged.
Figure 6C:
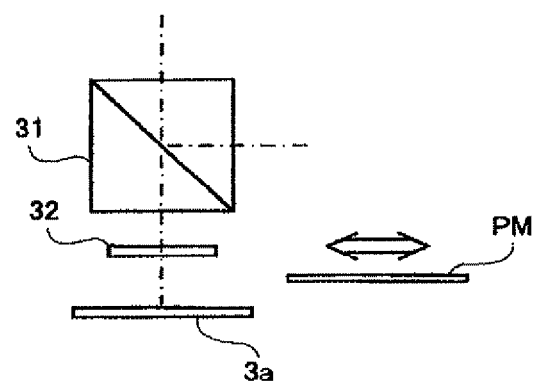
FIG. 6C is a drawing schematically showing major configurations of modification examples in which a plane mirror can be inserted immediately before a plurality of mirror elements of a spatial light modulator fixedly arranged.

In the modification examples shown in FIGS. 6A to 6C, in all of the case where the plane mirror PM and the diffractive optical element 6 both are retracted from the illumination optical path, the case where the plane mirror PM and the diffractive optical element 6 both are inserted in the illumination optical path, and the case where the plane mirror PM is retracted from the illumination optical path and where the diffractive optical element 6 is inserted in the illumination optical path, the optical path from the shaping optical system 2 to the front lens unit 7a of the afocal lens 7 can be regarded as the first optical path, the optical path from the shaping optical system 2 to the front lens unit 7a of the afocal lens 7 can be regarded as the second optical path, and the optical path of the optical system after the conical axicon system 9 can be regarded as the third optical path.

The plane mirror PM, as inserted into or retracted from the position immediately before the spatial light modulator 3, can function as a selector that can select either one situation through switching between the case wherein the light from the light source 1 is guided to the diffractive optical element 6 arranged in the first optical path and the case wherein the light from the light source 1 is guided to the spatial light modulator 3 arranged at the second position. Namely, when the plane mirror PM is inserted at the position immediately before the spatial light modulator 3, the light from the light source 1 can be guided to the diffractive optical element 6 arranged in the first optical path. Alternatively, when the plane mirror PM is retracted from the position immediately before the spatial light modulator 3, the light from the light source 1 can be guided to the spatial light modulator 3 arranged in the second optical path.

Figure 9:
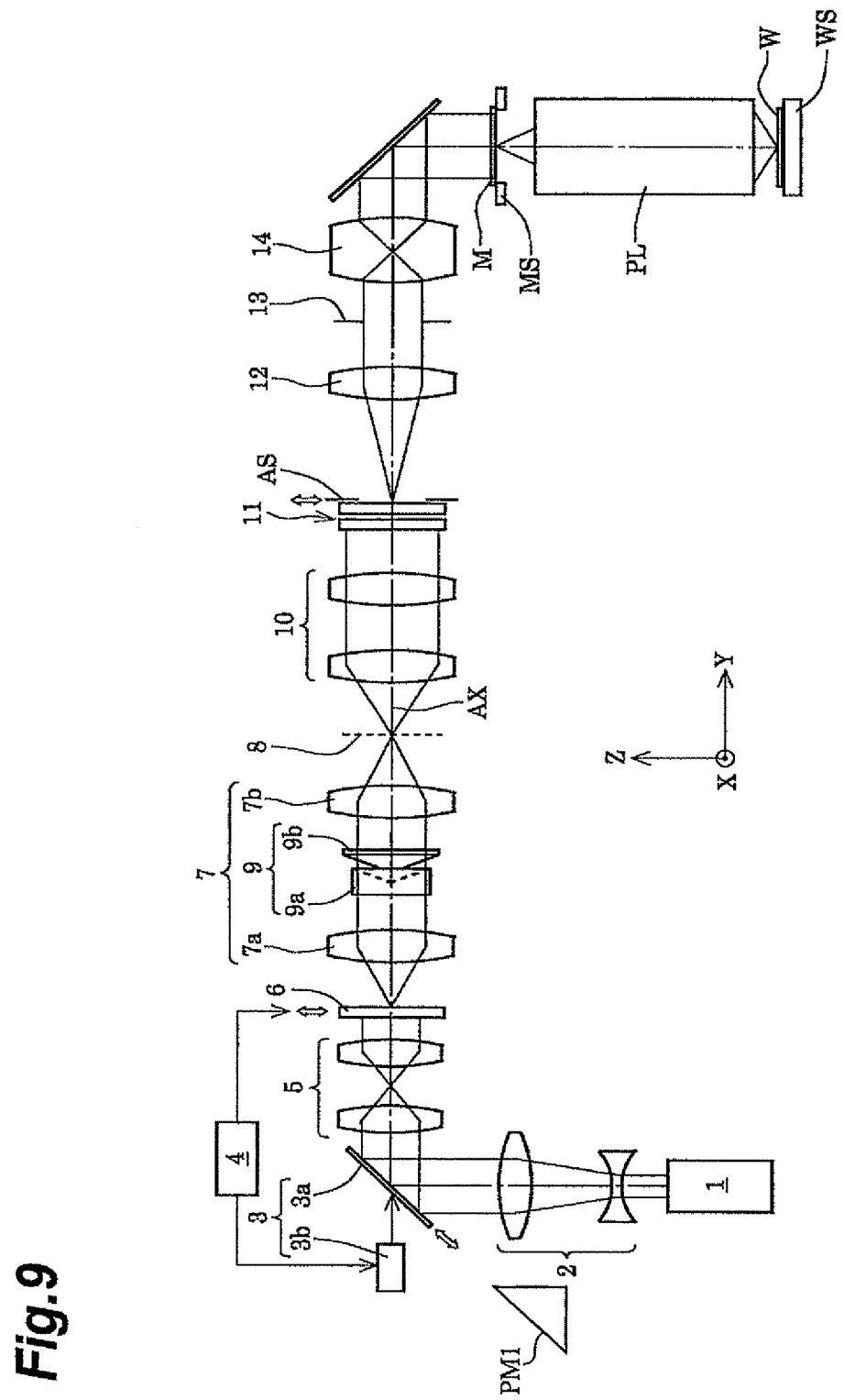
FIG. 9 is a drawing schematically showing a configuration of an exposure apparatus according to a modification example of the embodiment of the present invention.

In the above-described embodiment and modification examples, a prism mirror PM1 may be used instead of the plane mirror PM. FIG. 9 is a drawing schematically showing a configuration of a modification example wherein the prism mirror PM1 is used instead of the plane mirror PM in the exposure apparatus of the embodiment.

In the above-described embodiment and modification examples, the optical system may be modified so that in the formation of the illumination pupil luminance distribution using the spatial light modulator 3, the illumination pupil luminance distribution is measured with a pupil luminance distribution measuring device and the spatial light modulator 3 is controlled according to the result of the measurement.

Such technology is disclosed, for example, in Japanese Patent Application Laid-open No. 2006-54328 and in Japanese Patent Application Laid-open No. 2003-22967 and U.S. Pat. Published Application No. 2003/0038225 corresponding thereto. U.S. Pat. Published Application No. 2003/0038225 is incorporated as references herein. It is also possible to use, for example, the pupil luminance distribution measuring device disclosed in U.S. Pat. Published Application No. 2008/0030707. Teachings of U.S. Pat. Published Application No. 2008/0030707 are incorporated as reference herein.

In the aforementioned embodiment, the mask can be replaced with a variable pattern forming device which forms a predetermined pattern on the basis of predetermined electronic data. Use of such a variable pattern forming device can minimize influence on synchronization accuracy even when the pattern surface is vertical. The variable pattern forming device applicable herein can be, for example, a DMD (Digital Micromirror Device) including a plurality of reflective elements driven based on predetermined electronic data. The exposure apparatus with the MID is disclosed, for example, in Japanese Patent Application Laid-open No. 2004-304135 and International Publication WO 2006/080285. Besides the reflective spatial light modulators of the non-emission type like the DMD, it is also possible to use a transmissive spatial light modulator or a self-emission type image display device. It is noted that the variable pattern forming device can also be used in cases where the pattern surface is horizontal.

In the foregoing embodiment, it is also possible to apply the so-called liquid immersion method, which is a technique of filling a medium (typically, a liquid) with a refractive index larger than 1.1 in the optical path between the projection optical system and the photosensitive substrate. In this case, the technique of filling the liquid in the optical path between the projection optical system and the photosensitive substrate can be selected from the technique of locally filling the liquid as disclosed in PCT International Publication No. WO99/49504, the technique of moving a stage holding a substrate as an exposure target in a liquid bath as disclosed in Japanese Patent Application Laid-Open No. 6-124873, the technique of forming a liquid bath in a predetermined depth on a stage and holding the substrate therein as disclosed in Japanese Patent Application Laid-Open No. 10-303114, and so on. The PCT International Publication No. WO99/49504, Japanese Patent Application Laid-Open No. 6-124873, and Japanese Patent Application Laid-Open No. 10-303114 are incorporated herein by reference.

In the foregoing embodiment, it is also possible to apply the so-called polarized illumination method disclosed in U.S Pat. Published Application Nos. 2006/0203214, 2006/0170901, and 2007/0146676. Teachings of the U.S Pat. Published Application Nos. 2006/0203214, 2006/0170901, and 2007/0146676 are incorporated herein by reference.

The exposure apparatus of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus can be performed in a clean room in which the temperature, cleanliness, etc. are controlled.

Figure 7:
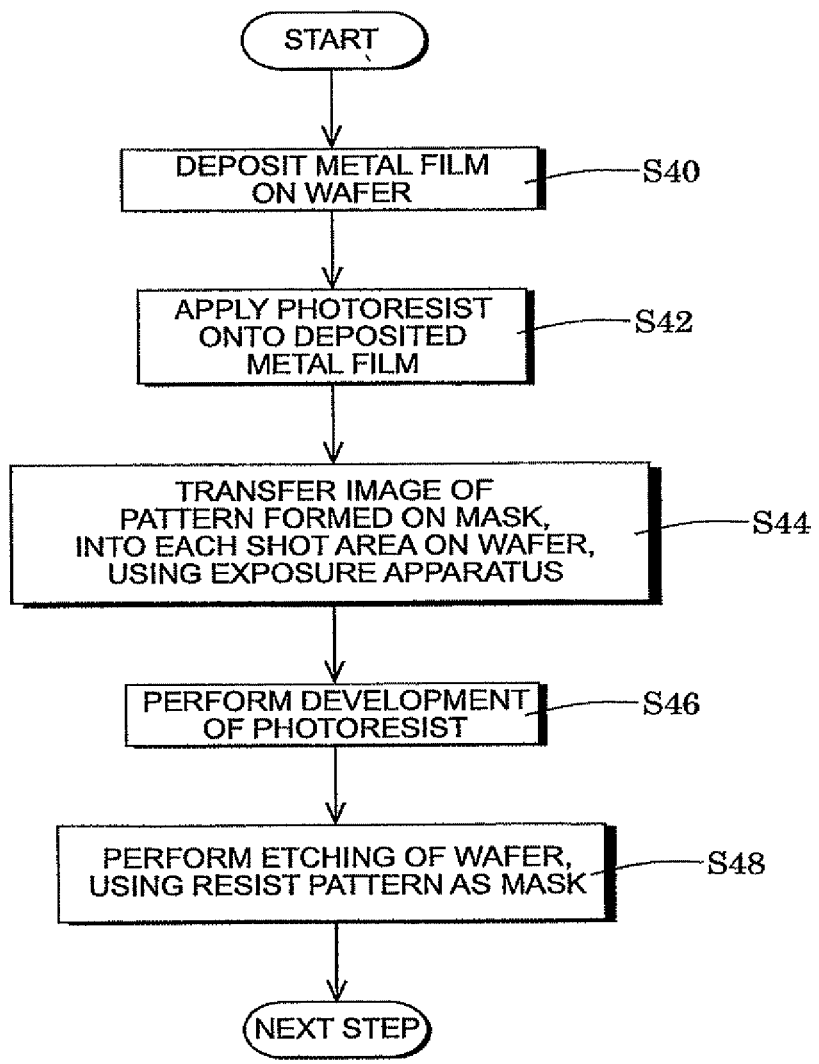
FIG. 7 is a flowchart showing manufacturing steps of semiconductor devices.

The following will describe a device manufacturing method using the exposure apparatus according to the above-described embodiment. FIG. 7 is a flowchart showing manufacturing blocks of semiconductor devices. As shown in FIG. 7, the manufacturing blocks of semiconductor devices include depositing a metal film on a wafer W as a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the projection exposure apparatus of the foregoing embodiment (block S44: exposure block), and developing the wafer W after completion of the transfer, i.e., developing the photoresist to which the pattern has been transferred (block S46: development block). Thereafter, using the resist pattern made on the surface of the wafer W in block S46, as a mask, processing such as etching is carried out on the surface of the wafer W (block S48: processing block).

The resist pattern herein is a photoresist layer in which depressions and projections are formed in a shape corresponding to the pattern transferred by the projection exposure apparatus of the foregoing embodiment and in which the depressions penetrate through the photoresist layer. Block S48 is to process the surface of the wafer W through this resist pattern. The processing carried out in block S48 includes, for example, at least either etching of the surface of the wafer W or deposition of a metal film or the like. In block S44, the projection exposure apparatus of the foregoing embodiment performs the transfer of the pattern onto the wafer W coated with the photoresist, as a photosensitive substrate or plate P.

Figure 8:
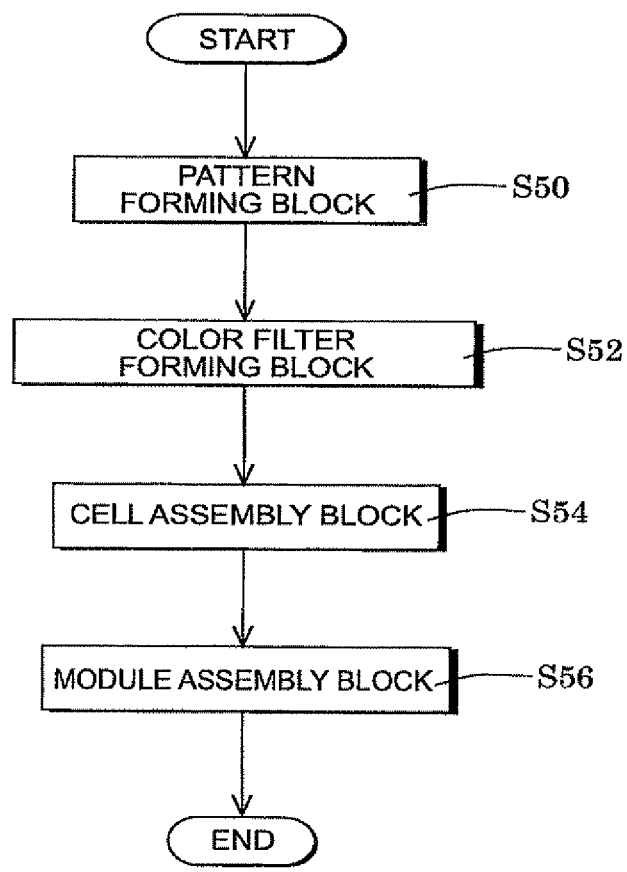
FIG. 8 is a flowchart showing manufacturing steps of a liquid-crystal device such as a liquid-crystal display device.

FIG. 8 is a flowchart showing manufacturing blocks of a liquid crystal device such as a liquid-crystal display device. As shown in FIG. 8, the manufacturing blocks of the liquid crystal device include sequentially performing a pattern forming block (block S50), a color filter forming block (block S52), a cell assembly block (block S54), and a module assembly block (block S56).

The pattern forming block of block S50 is to form predetermined patterns such as a circuit pattern and an electrode pattern on a glass substrate coated with a photoresist, as a plate P, using the projection exposure apparatus of the foregoing embodiment. This pattern forming block includes an exposure block of transferring a pattern to a photoresist layer, using the projection exposure apparatus of the foregoing embodiment, a development block of performing development of the plate P to which the pattern has been transferred, i.e., development of the photoresist layer on the glass substrate, to make the photoresist layer in the shape corresponding to the pattern, and a processing block of processing the surface of the glass substrate through the developed photoresist layer.

The color filter forming block of block S52 is to form a color filter in which a large number of sets of three dots corresponding to R (Red), G (Green), and B (Blue) are arrayed in a matrix pattern, or in which a plurality of sets of filters of three stripes of R, G, and B are arrayed in a horizontal scan direction.

The cell assembly block of block S54 is to assemble a liquid crystal panel (liquid crystal cell), using the glass substrate on which the predetermined pattern has been formed in block S50, and the color filter formed in block S52. Specifically, a liquid crystal is poured into between the glass substrate and the color filter to form the liquid crystal panel. The module assembly block of block S56 is to attach various components such as electric circuits and backlights for display operation of this liquid crystal panel, to the liquid crystal panel assembled in block S54.

The present invention is not limited to just the application to the exposure apparatus for manufacture of semiconductor devices, but can also be widely applied, for example, to the exposure apparatus for the liquid-crystal display devices formed on rectangular glass plates, or for display devices such as plasma displays, and the exposure apparatus for manufacture of various devices such as imaging devices (CCDs and others), micromachines, thin-film magnetic heads, and DNA chips. Furthermore, the present invention is also applicable to the exposure step (exposure apparatus) for manufacture of masks (photomasks, reticles, etc.) on which mask patterns of various devices are formed, by the photolithography process.

The above-described embodiment used the ArF excimer laser light (wavelength: 193 nm) or the KrF excimer laser light (wavelength: 248 nm) as the exposure light, but, without having to be limited to this, the present invention can also be applied to any other appropriate laser light source, e.g., an $F_2$ laser light source which supplies laser light at the wavelength of 157 nm.

The aforementioned embodiment was the application of the present invention to the illumination optical system illuminating the mask in the exposure apparatus, but, without having to be limited to this, the present invention can also be applied to a generally-used illumination optical system which illuminates a surface to be illuminated except for the mask.

The aforementioned embodiment relates to an illumination optical system suitable for an exposure apparatus for manufacturing such devices as semiconductor devices, imaging devices, liquid-crystal display devices, and thin-film magnetic heads by a lithography process. The aforementioned embodiment also relates to an optical element used with an illumination optical system for an exposure apparatus for manufacturing such devices as semiconductor devices, imaging devices, liquid-crystal display devices, and thin-film magnetic heads by a lithography process.

In the illumination optical systems according to the embodiments of the present invention, for example, when applied to an exposure apparatus, an appropriate illumination pupil luminance distribution according to characteristics of a pattern to be transferred can be quickly found by repeating actual exposures while changing the illumination pupil luminance distribution through the use of the spatial light modulator. Then the spatial light modulator is replaced by a diffractive optical element designed and manufactured so as to form an appropriate illumination pupil luminance distribution and exposures for mass production of devices are started using the diffractive optical element. As a result, a time of transition from adjustment of the illumination condition to mass production of devices can be reduced by quickly determining the appropriate illumination pupil luminance distribution with the use of the spatial light modulator, and an improvement in productivity of devices can be achieved by performing the mass production of devices with the use of the diffractive optical element having higher durability than the spatial light modulator.

In this manner, the illumination optical systems according to the embodiments of the present invention are able to realize a diversity of illumination conditions and, when applied to an exposure apparatus, it is able to achieve an improvement in productivity of devices.

The exposure apparatus according to the embodiment of the present invention is able to perform a good exposure under an appropriate illumination condition realized according to pattern characteristics, using the illumination optical system capable of realizing a diversity of illumination conditions, and, in turn, to manufacture good devices with high productivity.

In the method for manufacturing the optical element according to the embodiment of the present invention, actual exposures are repeated while changing in the illumination pupil luminance distribution through the use of the spatial light modulator, to quickly find an appropriate illumination pupil luminance distribution according to characteristics of a pattern to be transferred, and the optical element is manufactured so as to form the appropriate illumination pupil luminance distribution thus found; then exposures for mass production of devices are started using the optical element. As a result, the time of transition from the adjustment of the illumination condition to the mass production of devices can be reduced by quickly determining the appropriate illumination pupil luminance distribution through the use of the spatial light modulator, and an improvement in productivity of devices can be achieved by performing the mass production of devices with the use of the optical element having higher durability than the spatial light modulator.

In this manner, the manufacturing method of the optical element according to the embodiment of the present invention permits realization of the illumination condition according to the pattern characteristics and achievement of the improvement in productivity of devices. In other words, the exposure apparatus according to the embodiment of the present invention is able to perform a good exposure under an appropriate illumination condition realized according to pattern characteristics, using the illumination optical system illuminating a predetermined pattern with illumination light having passed via the optical element manufactured according to the embodiment of the present invention, and, in turn, to manufacture good devices with high productivity.

The invention is not limited to the fore going embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical system which illuminates a surface to be illuminated on the basis of light from a light source, the illumination optical system comprising:
    a first optical path in which a diffractive optical element can be arranged at a first position thereof;
    a second optical path in which a spatial light modulator with a plurality of optical elements arrayed two-dimensionally and controlled individually can be arranged at a second position thereof;
    a third optical path which is an optical path of light having passed via at least one of the first optical path and the second optical path and in which a distribution forming optical system is arranged, wherein the distribution forming optical system forms a predetermined light intensity distribution on an illumination pupil located in the third optical path, based on the light having passed via at least one of the first and second optical paths; and a selector that is configured to switch between an optical path in which the light from the light source is guided to the diffractive optical element arranged in the first optical path and an optical path in which the light source is guided to the spatial light modulator arranged at the second position.

2. The illumination optical system according to claim 1, wherein the second position is the same position as the first position or a position optically conjugate with the first position.

3. The illumination optical system according to claim 1, wherein the selector inserts or retracts a plane mirror or a prism mirror at or from the second position, thereby implementing selection of the optical path.

4. The illumination optical system according to claim 1, wherein the selector comprises a reflecting mirror which can be inserted at or retracted from a position immediately before the spatial light modulator.

5. The illumination optical system according to claim 1, wherein the spatial light modulator includes a plurality of mirror elements arrayed two-dimensionally, and a driving unit which individually controls and drives postures of the plurality of mirror elements.

6. The illumination optical system according to claim 5, wherein the driving unit continuously or discretely changes orientations of the plurality of mirror elements.

7. The illumination optical system according to claim 1, which is used in combination with a projection optical system which forms a surface optically conjugate with the surface to be illuminated, wherein the illumination pupil is at a position optically conjugate with an aperture stop of the projection optical system.

8. An exposure apparatus comprising the illumination optical system as set forth in claim 1, for illuminating a predetermined pattern, the exposure apparatus performing an exposure of the predetermined pattern on a photosensitive substrate.

9. A device manufacturing method comprising:

effecting the exposure of the predetermined pattern on the photosensitive substrate, using the exposure apparatus as set forth in claim 8;

developing the photosensitive substrate to which the pattern has been transferred, to form a mask layer in a shape corresponding to the pattern, on a surface of the photosensitive substrate; and processing the surface of the photosensitive substrate through the mask layer.

10. The illumination optical system according to claim 1, wherein the diffractive optical element is configured to retract from and insert at the first position.

\* \* \* \* \*